United States Patent
Akai et al.

(10) Patent No.: US 12,100,923 B2
(45) Date of Patent: Sep. 24, 2024

(54) CONNECTION STRUCTURE AND MANUFACTURING METHOD THEREFOR

(71) Applicant: SHOWA DENKO MATERIALS CO., LTD., Tokyo (JP)

(72) Inventors: Kunihiko Akai, Tokyo (JP); Masayuki Miyaji, Tokyo (JP); Junichi Kakehata, Tokyo (JP); Yoshinori Ejiri, Tokyo (JP); Toshimitsu Moriya, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 277 days.

(21) Appl. No.: 17/788,501

(22) PCT Filed: Dec. 4, 2020

(86) PCT No.: PCT/JP2020/045304
§ 371 (c)(1),
(2) Date: Jul. 12, 2022

(87) PCT Pub. No.: WO2021/131620
PCT Pub. Date: Jul. 1, 2021

(65) Prior Publication Data
US 2023/0060577 A1 Mar. 2, 2023

(30) Foreign Application Priority Data

Dec. 27, 2019 (JP) .................... 2019-239521

(51) Int. Cl.
*H01R 4/02* (2006.01)
*H01L 23/00* (2006.01)
(Continued)

(52) U.S. Cl.
CPC ............... *H01R 4/02* (2013.01); *H01L 24/05* (2013.01); *H01L 24/27* (2013.01); *H01L 24/29* (2013.01);
(Continued)

(58) Field of Classification Search
CPC ... H01L 24/83; H01L 2224/3201; H01R 4/02; H01R 4/58; H01R 12/52; H01R 12/613;
(Continued)

(56) References Cited

U.S. PATENT DOCUMENTS

2013/0000964 A1   1/2013  Kobayashi et al.
2021/0114147 A1*  4/2021  Akai .................. H01B 1/02

FOREIGN PATENT DOCUMENTS

JP      5-23887     2/1993
JP      2003-7894   1/2003
(Continued)

OTHER PUBLICATIONS

International Search Report issued Feb. 16, 2021 in corresponding International Application No. PCT/JP2020/045304.

*Primary Examiner* — Nathan Milakovich
(74) *Attorney, Agent, or Firm* — Wenderoth, Lind & Ponack, L.L.P.

(57) ABSTRACT

A connection structure including: a first circuit member having a plurality of first electrodes; a second circuit member having a plurality of second electrodes; and an intermediate layer having a plurality of bonding portions electrically connecting the first electrodes and the second electrodes, in which at least one of the first electrode and the second electrode that are connected by the bonding portion is a gold electrode, and 90% or more of the plurality of bonding portions include a first region containing a tin-gold alloy and connecting the first electrode and the second electrode and a second region containing bismuth and being in contact with the first region.

6 Claims, 25 Drawing Sheets

(51) Int. Cl.
| | |
|---|---|
| *H01R 4/58* | (2006.01) |
| *H01R 12/52* | (2011.01) |
| *H01R 12/61* | (2011.01) |
| *H01R 12/62* | (2011.01) |
| *H05K 1/18* | (2006.01) |
| *H05K 3/32* | (2006.01) |
| *H05K 3/34* | (2006.01) |
| *H05K 3/36* | (2006.01) |

(52) U.S. Cl.
CPC .............. *H01L 24/32* (2013.01); *H01L 24/83* (2013.01); *H01R 4/58* (2013.01); *H01R 12/52* (2013.01); *H01R 12/613* (2013.01); *H01R 12/62* (2013.01); *H05K 1/181* (2013.01); *H05K 3/323* (2013.01); *H05K 3/3463* (2013.01); *H05K 3/3478* (2013.01); *H05K 3/3494* (2013.01); *H05K 3/363* (2013.01); *H05K 3/368* (2013.01); *H01L 2224/05644* (2013.01); *H01L 2224/27003* (2013.01); *H01L 2224/2711* (2013.01); *H01L 2224/2929* (2013.01); *H01L 2224/29291* (2013.01); *H01L 2224/29311* (2013.01); *H01L 2224/29313* (2013.01); *H01L 2224/29499* (2013.01); *H01L 2224/3201* (2013.01); *H01L 2224/32145* (2013.01); *H01L 2224/32227* (2013.01); *H01L 2224/32505* (2013.01); *H01L 2224/83201* (2013.01); *H01L 2224/83444* (2013.01); *H01L 2224/83815* (2013.01); *H01L 2224/83851* (2013.01); *H01L 2224/83862* (2013.01); *H01L 2224/83905* (2013.01); *H01L 2924/01005* (2013.01); *H01L 2924/01013* (2013.01); *H01L 2924/01014* (2013.01); *H01L 2924/01015* (2013.01); *H01L 2924/01028* (2013.01); *H01L 2924/01029* (2013.01); *H01L 2924/0103* (2013.01); *H01L 2924/01031* (2013.01); *H01L 2924/01032* (2013.01); *H01L 2924/01033* (2013.01); *H01L 2924/01046* (2013.01); *H01L 2924/01047* (2013.01); *H01L 2924/01051* (2013.01); *H01L 2924/01052* (2013.01); *H01L 2924/01079* (2013.01); *H01L 2924/01082* (2013.01); *H01L 2924/0132* (2013.01); *H01L 2924/0133* (2013.01); *H01L 2924/014* (2013.01); *H01L 2924/0635* (2013.01); *H01L 2924/066* (2013.01); *H01L 2924/0665* (2013.01); *H01L 2924/0675* (2013.01); *H01L 2924/069* (2013.01); *H01L 2924/07001* (2013.01); *H01L 2924/07025* (2013.01); *H01L 2924/0705* (2013.01); *H01L 2924/0715* (2013.01); *H05K 2201/10636* (2013.01); *H05K 2201/10977* (2013.01)

(58) Field of Classification Search
CPC ........ H01R 12/62; H05K 1/181; H05K 3/323; H05K 3/3463; H05K 3/3478; H05K 3/3494; H05K 3/368; H05K 2201/10636; H05K 2201/10977
See application file for complete search history.

(56) References Cited

FOREIGN PATENT DOCUMENTS

| | | |
|---|---|---|
| JP | 2014-84395 | 5/2014 |
| JP | 2015-106654 | 6/2015 |
| JP | 2016-76494 | 5/2016 |
| JP | 2019-29135 | 2/2019 |
| WO | 2014/061085 | 4/2014 |

* cited by examiner

CONNECTION STRUCTURE AND MANUFACTURING METHOD THEREFOR

TECHNICAL FIELD

The present invention relates to a connection structure and a method for manufacturing a connection structure.

BACKGROUND ART

A semiconductor chip to be mounted on an electronic device is mounted on a circuit board by wire bonding, ball grid array (BGA) connection using solder balls, or the like, is then sealed with an insulating resin material, and is used as a function integrated body called a semiconductor package. In particular, the BGA connection can narrow a pitch between electrodes, and thus has contributed to a decrease in size of a semiconductor package (Patent Literature 1).

In recent years, for small-sized and high-performance products such as smartphones and tablets, height-reducing, thinning, and increasing performance of a semiconductor package has proceeded, and increasing of the number of electrodes to be connected and narrowing of a pitch between electrodes have proceeded. In a primary connection side of a semiconductor package, in order to realize narrow pitch connection of 100 µm or less, a soldered Cu pillar structure has been used in which solder is laminated at a tip of a copper pillar (Patent Literature 2).

Furthermore, from the viewpoint of environmental performance, lead-free solder with silver or copper added to tin had been used since 2000s, and mounting has been performed at a reflow temperature of about 260° C. However, in a semiconductor package that is a composite body of a metal, glass, a resin, and the like, a problem arises in that a stress is applied to a mounting portion (soldering portion) from a difference in thermal expansion coefficient between respective materials due to thermal history by reflow at 260° C., resulting in breakage. Furthermore, in the case of reflow at 260° C., a problem also arises in that solder and a metal material of an electrode are alloyed to generate an alloy layer that promotes breakage. Furthermore, a problem arises in that reflow at 260° C. is required for tin-silver-based solder, and thus a less expensive resin material cannot be applied. Patent Literature 3 discloses a mounting method using a low-temperature solder that uses tin and bismuth and has a melting point of 200° C. or lower. However, the tin-bismuth solder has a problem in that a solder bonding portion is easily broken by an impact from the outside since bismuth is brittle. In Patent Literature 4, an attempt has been conducted in which the brittleness of a bonding portion is improved by adding a trace amount of a metal to tin-bismuth solder.

Meanwhile, as a method of collectively and electrically connecting a large number of electrodes, anisotropically conductive materials such as an anisotropically conductive film and an anisotropically conductive paste have been hitherto used. The anisotropically conductive materials have been used for collectively mounting a large number of wirings such as mounting of a control IC on a display or connection and mounting of tab wires, and make it possible connection of narrow pitches below 30 µm in recent years. As conductive particles to be blended with these anisotropically conductive materials, it has been hitherto studied to use solder particles. For example, Patent Literature 5 describes a conductive paste that contains a thermosetting component and a plurality of solder particles subjected to a specific surface treatment.

CITATION LIST

Patent Literature

Patent Literature 1: Japanese Unexamined Patent Publication No. 2003-7894
Patent Literature 2: Japanese Unexamined Patent Publication No. 2015-106654
Patent Literature 3: Japanese Unexamined Patent Publication No. 2014-84395
Patent Literature 4: International Publication WO 2014061085
Patent Literature 5: Japanese Unexamined Patent Publication No. 2016-76494

SUMMARY OF INVENTION

Technical Problem

As described above, in recent years, with a decrease in connection temperature corresponding to diversity of circuit members and high definition of circuit members, a decrease in size and thickness of connection points has proceeded, and thus it becomes difficult to secure the conduction reliability of a connection structure.

The present invention has been made in view of the above circumstances, and an object thereof is to provide a connection structure excellent in conduction reliability and insulation reliability and a manufacturing method therefor.

Solution to Problem

An aspect of the present invention relates to a connection structure including: a first circuit member having a plurality of first electrodes; a second circuit member having a plurality of second electrodes; and an intermediate layer having a plurality of bonding portions electrically connecting the first electrodes and the second electrodes, in which at least one of the first electrode and the second electrode that are connected by the bonding portion is a gold electrode, and 90% or more of the plurality of bonding portions include a first region containing a tin-gold alloy and connecting the first electrode and the second electrode and a second region containing bismuth and being in contact with the first region.

In an embodiment, the intermediate layer may further have an insulating resin layer sealing a space between the first circuit member and the second circuit member.

Another aspect of the present invention relates to a method for manufacturing a connection structure, the method including: a preparing step of preparing a first circuit member having a plurality of first electrodes, a second circuit member having a plurality of second electrodes, and an anisotropically conductive film; a disposing step of disposing the first circuit member, the second circuit member, and the anisotropically conductive film such that a surface of the first circuit member on which the first electrodes are provided and a surface of the second circuit member on which the second electrodes are provided to face each other with the anisotropically conductive film interposed therebetween, to obtain a laminate in which the first circuit member, the anisotropically conductive film, and the second circuit member are laminated in this order; and a connecting step of electrically connecting the first electrodes and the second electrodes via the bonding portions by heating the laminate in a state of being pressed in a thickness direction. In this manufacturing method, at least one of the first electrode and the second electrode is a gold electrode, and the anisotropically conductive film includes an insulating film constituted by an insulating resin composition and a plurality of solder particles disposed in the insulating film. Furthermore, the solder particle contains a tin-bismuth alloy, and the average particle diameter of the solder particle is 1 μm to 30 μm, and the C.V. value of the solder particle is 20% or less. Furthermore, in a longitudinal section of the anisotropically conductive film, the solder particle is disposed to be arranged in a transverse direction in a state of being spaced apart from the solder particle adjacent thereto. Furthermore, 90% or more of the plurality of bonding portions to be formed in the connecting step include a first region containing a tin-gold alloy and connecting the first electrode and the second electrode and a second region containing bismuth and being in contact with the first region.

In an embodiment, the solder particle may be a solder particle manufactured by a method including: a solder fine particle preparing step of preparing a base substrate having a plurality of recesses and solder fine particles containing a tin-bismuth alloy; an accommodating step of accommodating at least some of the solder fine particles in the recess; and a fusing step of fusing the solder fine particles accommodated in the recess to form a solder particle inside the recess.

In an embodiment, the C.V. value of the solder fine particle to be prepared in the solder fine particle preparing step may exceed 20.

In the embodiment, the anisotropically conductive film may be an anisotropically conductive film manufactured by a method including: a transferring step of bringing an insulating resin composition into contact with an opening side of a recess of a base substrate having a plurality of recesses in which the solder particles are accommodated in the recesses, to obtain a first resin layer to which the solder particles are transferred; and a laminating step of forming a second resin layer constituted by an insulating resin composition on a surface of the first resin layer on a side to which the solder particles are transferred, to obtain an anisotropically conductive film.

Advantageous Effects of Invention

According to the present invention, there are provided a connection structure excellent in conduction reliability and insulation reliability and a manufacturing method therefor.

DESCRIPTION OF EMBODIMENTS

Figure 1:
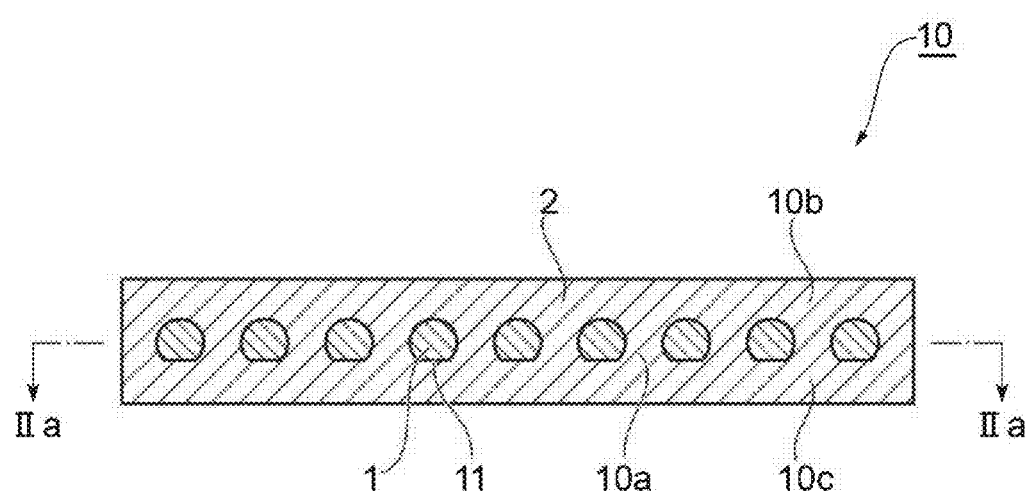
FIG. 1 is a cross-sectional view schematically illustrating a first embodiment of an anisotropically conductive film.

Hereinafter, embodiments of the present invention will be described. The present invention is not limited to the following embodiments. Note that, materials listed as examples below may be used singly or in combinations of two or more, unless otherwise specifically indicated. When a plurality of substances corresponding to each component exist in the composition, the content of each component in the composition means the total amount of the plurality of substances that exist in the composition, unless otherwise specified. A numerical range that has been indicated by use of "to" indicates the range that includes the numerical values which are described before and after "to", as the minimum value and the maximum value, respectively. In the numerical ranges that are described stepwise in the present specification, the upper limit value or the lower limit value of the numerical range of a certain stage may be replaced with the upper limit value or the lower limit value of the numerical range of another stage. In the numerical ranges that are described in the present specification, the upper limit value or the lower limit value of the numerical range may be replaced with the value shown in Examples.

A connection structure according to the present embodiment includes a first circuit member having a plurality of first electrodes, a second circuit member having a plurality of second electrodes, and an intermediate layer having a plurality of bonding portions electrically connecting the first electrodes and the second electrodes. Furthermore, at least one of the first electrode and the second electrode that are connected by the bonding portion is a gold electrode, and 90% or more of the plurality of bonding portions include a first region containing a tin-gold alloy and connecting the first electrode and the second electrode and a second region containing bismuth and being in contact with the first region.

The connection structure according to the present embodiment includes a bonding portion that includes a first region connecting the first electrode and the second electrode to each other and a second region being in contact with the first region. In this bonding portion, the first region contains a tin-gold alloy and is integrated, and the second region functions as a reinforcing portion, so that cracks hardly occur. Furthermore, in this bonding portion, since the first region contains a tin-gold alloy having a high melting point, re-melting of the bonding portion is sufficiently suppressed. In the connection structure according to the present embodiment, since 90% or more of the bonding portions include the first region and the second region as described above, occurrence of cracks in the bonding portion and melting of the bonding portion are sufficiently suppressed, and the connection structure is excellent in conduction reliability. Furthermore, since the melting of the bonding portion is sufficiently suppressed, the connection structure according to the present embodiment is easily applied to secondary mounting or the like, and is also suitable for use in a high-temperature environment.

The intermediate layer may further have an insulating resin layer sealing a space between the first circuit member and the second circuit member. The insulating resin layer may be formed by an insulating film of the anisotropically conductive film described below.

In the present embodiment, the proportion of the bonding portions including the first region and the second region among the bonding portions in the connection structure is 80% or more, preferably 85% or more, and more preferably 90% or more, and may be 100%.

In order to make the most part of the bonding portions of the connection structure include the first region and the second region, it is desirable that solder particles to be provided for formation each bonding portion are uniform. Furthermore, in order to make the most part of the bonding portions of the connection structure include the first region and the second region, it is desirable that an insulating resin composition is disposed around solder particles, and when the solder particles are melted, the molten solder is maintained between the first electrode and the second electrode for a sufficient time. From these viewpoints, in the connection structure according to the present embodiment, it is preferable that the first circuit member and the second circuit member are bonded to each other using an anisotropically conductive film described below.

Hereinafter, preferred embodiments of the anisotropically conductive film useful in manufacturing a connection structure and a manufacturing method therefor, and a connection structure and a manufacturing method therefor will be described with reference to the drawings.

<Anisotropically Conductive Film>

An anisotropically conductive film 10 according to a first embodiment illustrated in FIG. 1 includes an insulating film 2 made of an insulating resin composition and a plurality of solder particles 1 disposed in the insulating film 2. In a predetermined longitudinal section of the anisotropically conductive film 10, one solder particle 1 is disposed to be arranged in a transverse direction (in a right-left direction in FIG. 1) in a state where the one solder particle 1 is spaced apart from another solder particle 1 adjacent thereto. In other words, the anisotropically conductive film 10 includes, in a longitudinal section thereof, a central region 10a in which the plurality of solder particles 1 are arrayed in the transverse direction and surface-side regions 10b and 10c in which the solder particles 1 are not substantially present.

Figure 2A:
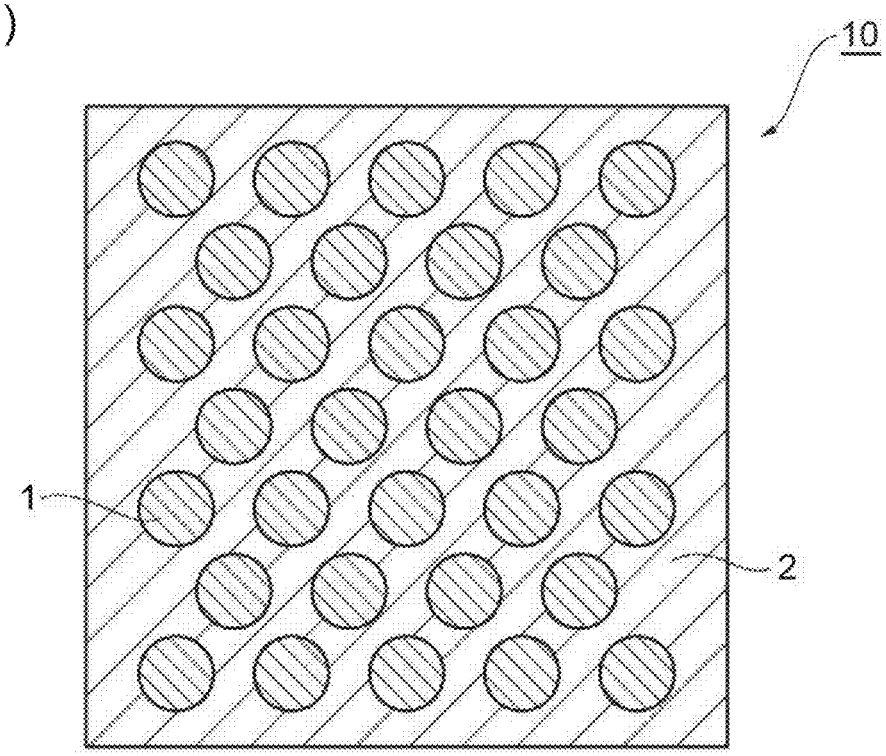
FIG. 2(a) is a schematic transverse cross-sectional view taken along line IIa-IIa illustrated in FIG. 1.
Figure 2B:
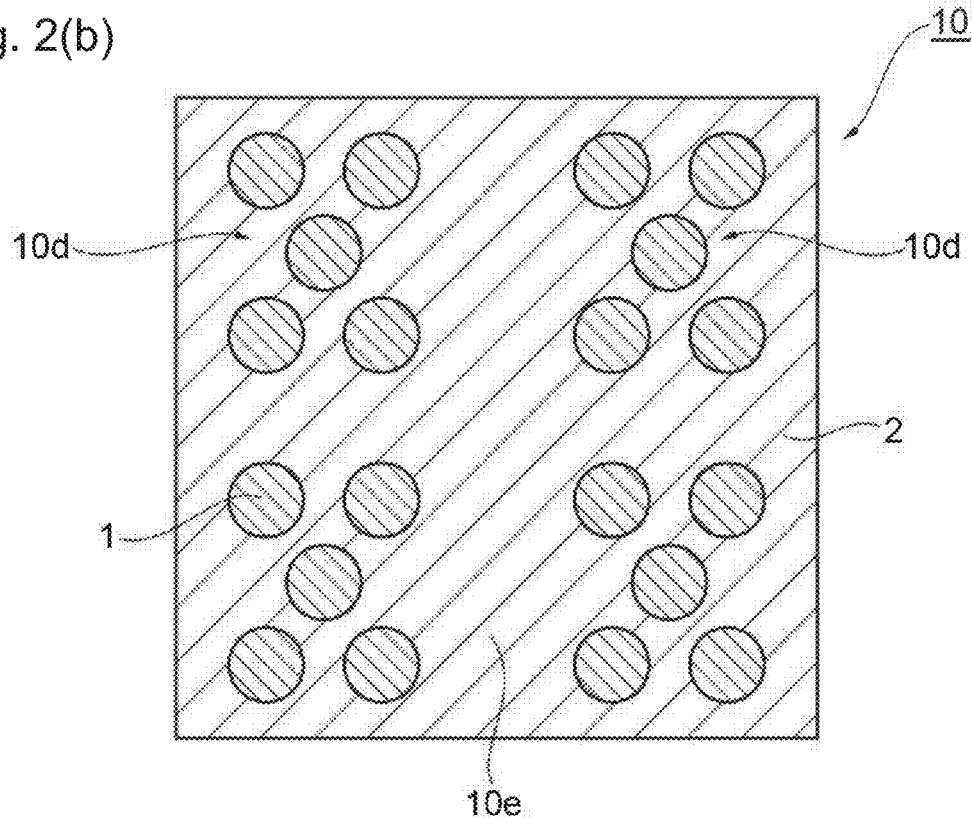
FIG. 2(b) is a transverse cross-sectional view schematically illustrating a modification example of the first embodiment.

FIG. 2(a) is a schematic transverse cross-sectional view taken along line IIa-IIa illustrated in FIG. 1. As illustrated in FIG. 2, in a transverse cross-section of the anisotropically conductive film 10, the solder particles 1 are regularly disposed. As illustrated in FIG. 2(a), the solder particles 1 may be disposed regularly and with roughly equal intervals with respect to the entire region of the anisotropically conductive film 10, and as in a modification example illustrated in FIG. 2(b), in the transverse cross-section of the anisotropically conductive film 10, the solder particles 1 may be disposed such that a region 10d in which the plurality of solder particles 1 are regularly disposed and a region 10e in which the solder particles 1 are not substantially present are regularly formed. For example, the position, the number, and the like of the solder particles 1 may be set depending on the shape, the size, the pattern, and the like of electrodes to be connected.

(Solder Particle)

The average particle diameter of the solder particle 1 is, for example, 30 µm or less, preferably 25 µm or less, more preferably 20 μm or less, and further preferably 15 μm or less. Furthermore, the average particle diameter of the solder particle 1 is, for example, 1 μm or more, preferably 2 μm or more, more preferably 3 μm or more, and further preferably 5 μm or more.

The average particle diameter of the solder particle 1 can be measured using various methods suitable for sizes. For example, methods such as a dynamic light scattering method, a laser diffraction method, a centrifugal sedimentation method, an electrical sensing zone method, a resonance mass measurement method can be used. Further, a method of measuring a particle size from an image obtained with an optical microscope, an electronic microscope, or the like can be used. Specific examples of a device include a flow-type particle image analyzer, a Microtrac, and a Coulter counter.

The C.V. value of the solder particle 1 is preferably 20% or less, more preferably 10% or less, and further preferably 7% or less, from the viewpoint that more excellent conduction reliability and insulation reliability can be realized. Furthermore, the lower limit of the C.V. value of the solder particle 1 is not particularly limited. For example, the C.V. value of the solder particle 1 may be 1% or more or may be 2% or more.

The C.V. value of the solder particle 1 is calculated by multiplying a value, which is obtained by dividing the standard deviation of the particle diameter measured by the aforementioned method by the average particle diameter, by 100.

Figure 7A:
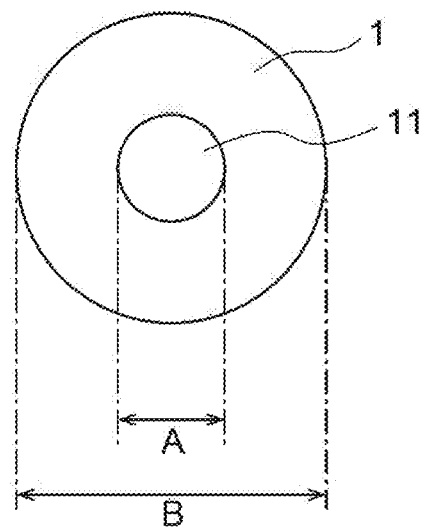
FIG. 7(a) is a view when a solder particle is seen from a side opposite to an opening portion of a recess in FIG. 6.

As illustrated in FIG. 7(a), in the solder particle 1, a planar portion 11 may be formed on a part of the surface, and at this time, a surface other than the planar portion 11 has preferably a spherical cap shape. That is, the solder particle 1 may have the planar portion 11 and a curved surface portion having a spherical cap shape. A ratio (A/B) of a diameter A of the planar portion 11 to a diameter B of the solder particle 1 may be, for example, more than 0.01 and less than 1.0 (0.01<A/B<1.0) or may be 0.1 to 0.9. When the solder particle 1 has the planar portion 11, positional deviation due to pressurization during connection is difficult to occur, and more excellent conduction reliability and insulation reliability can be realized.

In a case where a quadrangle circumscribing a projection image of the solder particle 1 is created by two pairs of parallel lines, when distances X and Y (provided that Y<X) between sides facing each other, a ratio (Y/X) of Y to X may be more than 0.8 and less than 1.0 (0.8<Y/X<1.0), or may be 0.9 or more and less than 1.0. The solder particle 1 as described above can be a particle closer to a perfect sphere. According to a manufacturing method described below, such a solder particle 1 can be easily obtained. As the solder particle 1 is close to a perfect sphere, there are tendencies that non-uniform contact between the solder particle 1 and the electrode is difficult to occur, and stable connection is obtained, for example, when a plurality of facing electrodes are electrically connected via the solder particles 1. Furthermore, when a conductive film or resin in which the solder particles 1 are dispersed in a resin composition is produced, there are tendencies that high dispersibility is obtained, and dispersion stability during manufacturing is obtained. Further, in the case of using a film or paste in which the solder particles 1 are dispersed in a resin composition for connection between electrodes, even when the solder particles 1 rotate in a resin, the projection areas of the solder particles 1 are close to each other when viewed in projection image as long as the solder particles 1 have a sphere shape. Therefore, there is a tendency that stable electrical connection with less variation at the time of connection between electrodes is easily obtained.

Figure 7B:
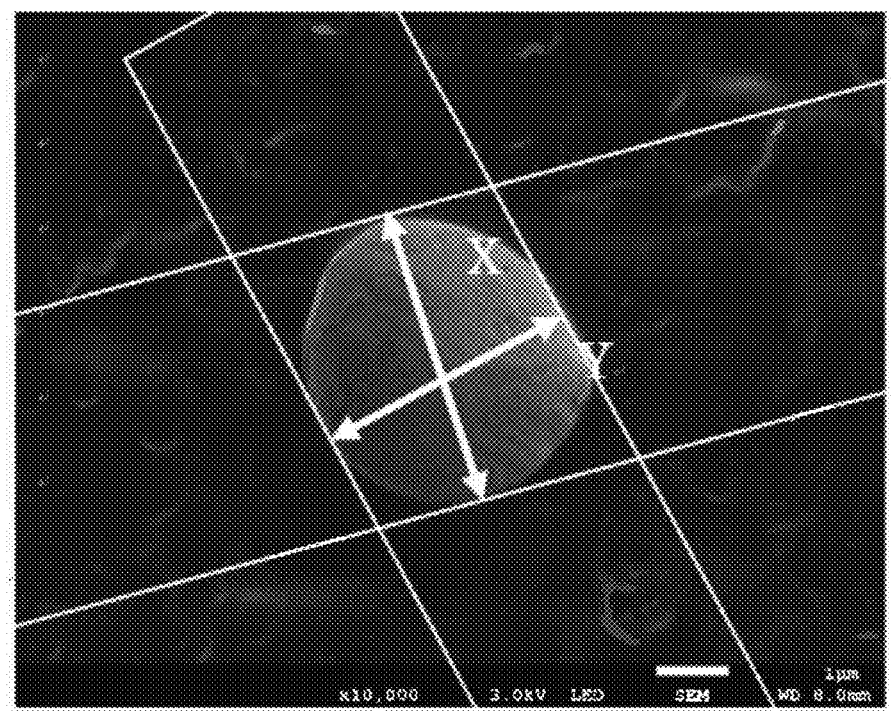
FIG. 7(b) is a view showing distances X and Y (provided that Y≤X) between sides facing each other in a case where a quadrangle circumscribing a projection image of the solder particle is created by two pairs of parallel lines.

FIG. 7(b) is a view showing distances X and Y (provided that Y<X) between sides facing each other in a case where a quadrangle circumscribing a projection image of the solder particle is created by two pairs of parallel lines. For example, an arbitrary particle is observed with a scanning electron microscope to obtain a projection image. Two pairs of parallel lines are drawn on the obtained projection image, one pair of parallel lines are disposed at a position at which a distance between the parallel lines is minimized, the other pair of parallel lines are disposed at a position at which a distance between the parallel lines is maximized, and Y/X of the particle is determined. This operation is performed with respect to 300 solder particles, an average value is calculated, and this average value is regarded as Y/X of the solder particle.

The solder particle 1 contains a tin-bismuth alloy (Sn—Bi alloy). Specific examples of the tin-bismuth alloy include the following examples.

Sn—Bi (Sn 43% by mass, Bi 57% by mass, melting point: 138° C.)

Sn—Bi (Sn 72% by mass, Bi 28% by mass, melting point: 138° C.)

Sn—Bi—Ag (Sn 42% by mass, Bi 57% by mass, Ag 1% by mass, melting point: 139° C.)

The solder particle 1 may further contain metals other than Sn and Bi. Examples of the other metals include Ag, Cu, Ni, Bi, Zn, Pd, Pb, Au, P, B, Ga, As, Sb, Te, Ge, Si, and Al. The content rate of the other metal of the solder particle 1 is, for example, 10% by mass or less, preferably 5% by mass or less, and more preferably 3% by mass or less.

(Insulating Film)

The insulating resin composition constituting the insulating film 2 may contain a thermosetting compound. Examples of the thermosetting compound include an oxetane compound, an epoxy compound, an episulfide compound, a (meth)acrylic compound, a phenol compound, an amino compound, an unsaturated polyester compound, a polyurethane compound, a silicone compound, and a polyimide compound. Among these, from the viewpoint of making the curability and the viscosity of the insulating resin further favorable so that connection reliability is further enhanced, an epoxy compound is preferred.

The insulating resin composition may further contain a thermal curing agent. Examples of the thermal curing agent include an imidazole curing agent, an amine curing agent, a phenol curing agent, a polythiol curing agent, an acid anhydride, a thermal cationic initiator, and a thermal radical generator. These may be used singly or in combination of two or more kinds thereof. Among these, from the viewpoint that rapid curing is possible at a low temperature, an imidazole curing agent, a polythiol curing agent, or an amine curing agent are preferred. Furthermore, since storage stability is increased when a thermosetting compound and a thermal curing agent are mixed, a latent curing agent is preferred. The latent curing agent is preferably a latent imidazole curing agent, a latent polythiol curing agent, or a latent amine curing agent. Note that, the above-described thermal curing agent may be coated with a polymeric substance such as a polyurethane resin or a polyester resin.

The imidazole curing agent is not particularly limited, and examples thereof include 2-methylimidazole, 2-ethyl-4-methylimidazole, 1-cyanoethyl-2-phenylimidazole, 1-cyanoethyl-2-phenylimidazolium trimellitate, 2,4-diamino-6-

[2'-methylimidazolyl-(1')]-ethyl-s-triazine, and 2,4-diamino-6-[2'-methylimidazolyl-(1')]-ethyl-s-triazine isocyanuric acid adducts.

The polythiol curing agent is not particularly limited, and examples thereof include trimethylolpropane tris-3-mercaptopropionate, pentaerythritol tetrakis-3-mercaptopropionate, and dipentaerythritol hexa-3-mercaptopropionate. The solubility parameter of the polythiol curing agent is preferably 9.5 or more and preferably 12 or less. The solubility parameter is calculated by the Fedors method. For example, the solubility parameter of trimethylolpropane tris-3-mercaptopropionate is 9.6, and the solubility parameter of dipentaerythritol hexa-3-mercaptopropionate is 11.4.

The amine curing agent is not particularly limited, and examples thereof include hexamethylenediamine, octamethylenediamine, decamethylenediamine, 3,9-bis(3-aminopropyl)-2,4,8,10-tetraspiro[5.5]undecane, bis(4-aminocyclohexyl)methane, meta-phenylene diamine, and diaminodiphenyl sulfone.

Examples of a thermal cationic curing agent include an iodonium-based cationic curing agent, an oxonium-based cationic curing agent, and a sulfonium-based cationic curing agent. Examples of the iodonium-based cationic curing agent include bis(4-tert-butylphenyl)iodonium hexafluorophosphate. Examples of the oxonium-based cationic curing agent include trimethyloxonium tetrafluoroborate. Examples of the sulfonium-based cationic curing agent include tri-p-tolylsulfonium hexafluorophosphate.

The thermal radical generator is not particularly limited, and examples thereof include an azo compound and an organic peroxide. Examples of the azo compound include azobisisobutyronitrile (AIBN). Examples of the organic peroxide include di-tert-butyl peroxide and methyl ethyl ketone peroxide.

(Flux)

The anisotropically conductive film 10 preferably contains a flux. Specifically, it is preferable that the insulating resin composition constituting the anisotropically conductive film 10 contains a flux and the flux is covered on the surface of the solder particle 1. The flux melts an oxide on the solder surface and improves the fusing property between the solder particles and the wettability of the solder to the electrode.

As the flux, fluxes that are generally used in solder bonding or the like can be used. Specific examples thereof include zinc chloride, mixtures of zinc chloride and an inorganic halide, mixtures of zinc chloride and an inorganic acid, molten salts, phosphoric acid, derivatives of phosphoric acid, organic halides, hydrazine, organic acids, and pine resins. These may be used singly or in combination of two or more kinds thereof.

Examples of the molten salt include ammonium chloride. Examples of the organic acid include lactic acid, citric acid, stearic acid, glutamic acid, and glutaric acid. Examples of the pine resin include an activated pine resin and a non-activated pine resin. The pine resin is a rosin having abietic acid as a main component. By using an organic acid having two or more carboxyl groups or a pine resin as the flux, an effect that conduction reliability between electrodes is further enhanced is exhibited.

The melting point of the flux is preferably 50° C. or higher, more preferably 70° C. or higher, and further preferably 80° C. or higher. The melting point of the flux is preferably 200° C. or lower, more preferably 160° C. or lower, further preferably 150° C. or lower, and particularly preferably 140° C. or lower. When the melting point of the flux is the lower limit or more and the upper limit or less, the flux effect is further effectively exhibited, and the solder particles are further efficiently disposed on the electrodes. The range of the melting point of the flux is preferably 80 to 190° C. and more preferably 80 to 140° C. or lower.

Examples of a flux having a melting point in a range of 80 to 190° C. include dicarboxylic acids such as succinic acid (melting point: 186° C.), glutaric acid (melting point: 96° C.), adipic acid (melting point: 152° C.), pimelic acid (melting point: 104° C.), and suberic acid (melting point: 142° C.), benzoic acid (melting point: 122° C.), and malic acid (melting point: 130° C.).

<Method for Manufacturing Anisotropically Conductive Film>

The method for manufacturing the anisotropically conductive film 10 includes a solder fine particle preparing step of preparing a base substrate having a plurality of recesses and solder fine particles, an accommodating step of accommodating at least some of the solder fine particles in the recess, a fusing step of fusing the solder fine particles accommodated in the recess to form a solder particle inside the recess, a transferring step of bringing an insulating resin composition into contact with an opening side of the recess of the base substrate in which the solder particles is accommodated in the recesses, to obtain a first resin layer to which the solder particles are transferred, and a laminating step of forming a second resin layer constituted by an insulating resin composition on a surface of the first resin layer on a side to which the solder particles are transferred, to obtain an anisotropically conductive film.

The method for manufacturing the anisotropically conductive film 10 according to the first embodiment will be described with reference to FIGS. 3 to 8.

Figure 3A:
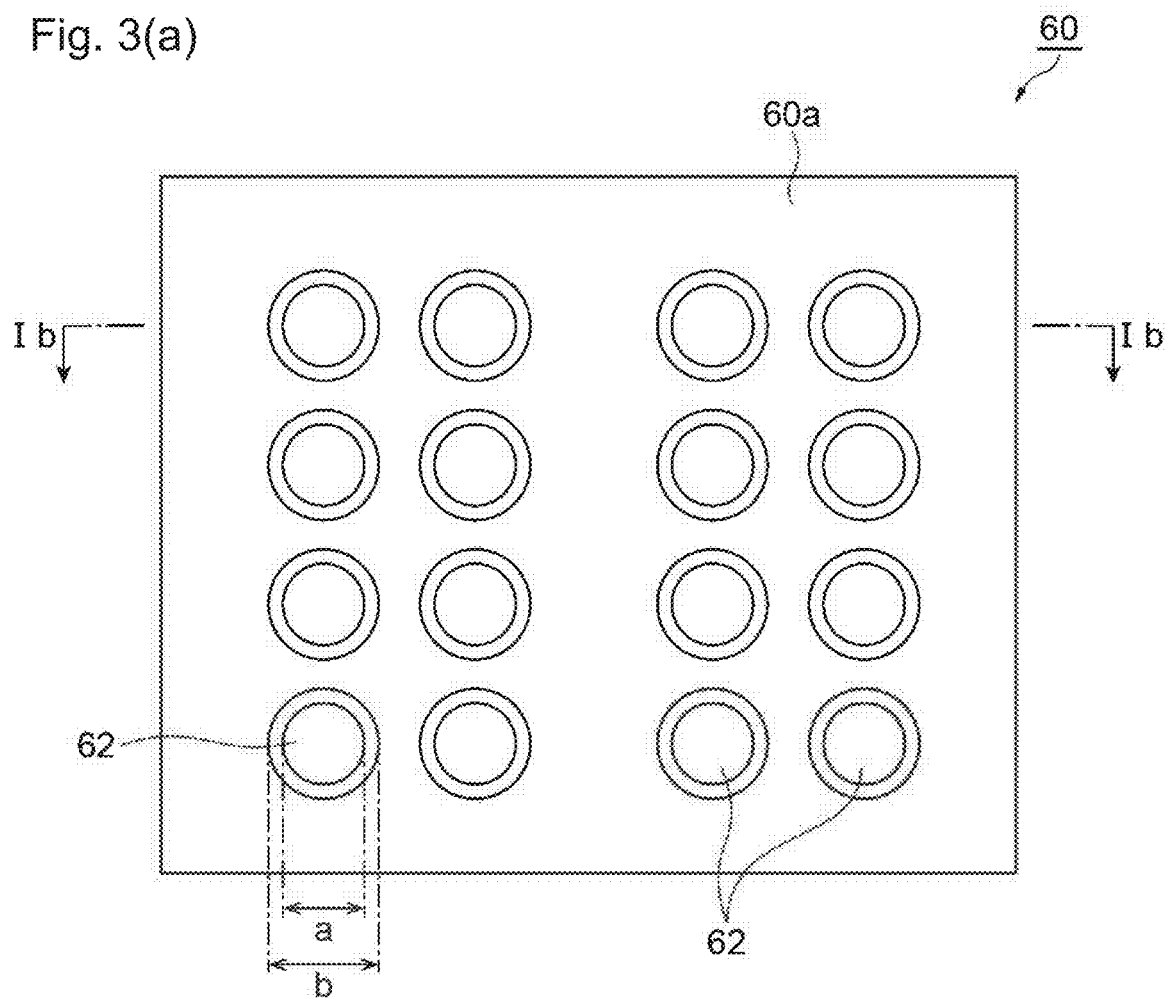
FIG. 3(a) is a plan view schematically illustrating an example of a base substrate.
Figure 3B:
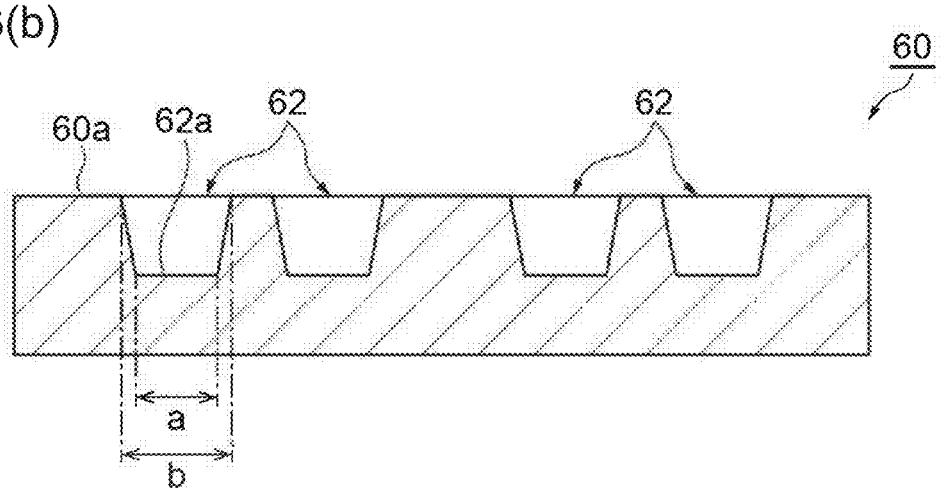
FIG. 3(b) is a cross-sectional view taken along line Ib-Ib of FIG. 3(a).
Figure 4A:
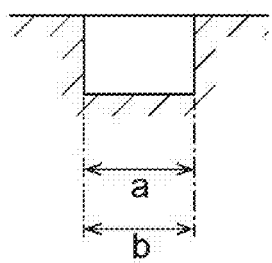
FIGS. 4(a) to 4(h) are cross-sectional views schematically illustrating examples of a cross-sectional shape of a recess of the base substrate.
Figure 4B:
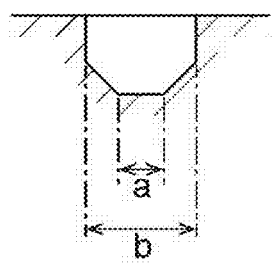
Figure 4C:
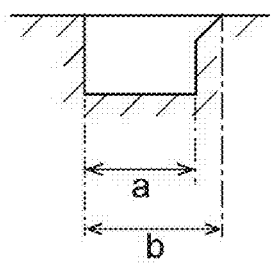
Figure 4D:
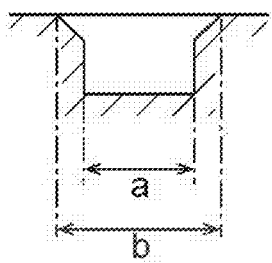
Figure 4E:
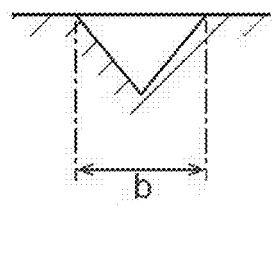
Figure 4F:
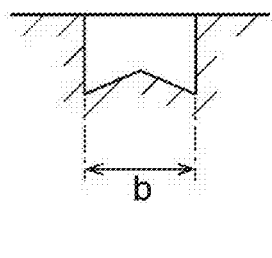
Figure 4G:
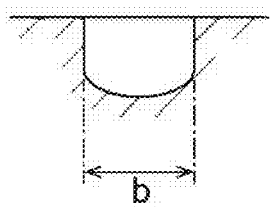
Figure 4H:
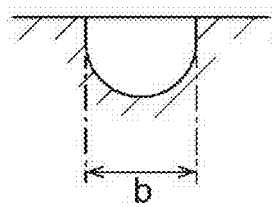

First, solder fine particles and a base substrate 60 for accommodating the solder fine particles are prepared. FIG. 3(*a*) is a plan view schematically illustrating an example of the base substrate 60, and FIG. 3(*b*) is a cross-sectional view taken along line Ib-Ib illustrated in FIG. 3(*a*). The base substrate 60 illustrated in FIG. 3(*a*) has the plurality of recesses 62. The plurality of recesses 62 may be regularly disposed with a predetermined pattern. In this case, the base substrate 60 can be used directly in a transferring step described below.

The recess 62 of the base substrate 60 is preferably formed in a tapered shape in which the opening area expands from a bottom portion 62*a* side of the recess 62 toward a surface 60*a* of the base substrate 60. That is, as illustrated in FIG. 3(*a*) and FIG. 3(*b*), the width (width a in FIG. 3(*a*) and FIG. 3(*b*)) of the bottom portion 62*a* of the recess 62 is preferably narrower than the width (width b in FIG. 3(*a*) and FIG. 3(*b*)) of the opening of the recess 62 on the surface 60*a*. Further, the size (such as the width a, the width b, the volume, and the tapering angle and depth) of the recess 62 may be set depending on the size of a target solder particle.

Note that, the shape of the recess 62 may be a shape other than the shapes illustrated in FIG. 3(*a*) and FIG. 3(*b*). For example, the shape of the opening of the recess 62 on the surface 60*a* may be an elliptical shape, a triangular shape, a quadrangular shape, a polygonal shape, and the like, in addition to the circular shape as illustrated in FIG. 3(*a*).

Figure 24:
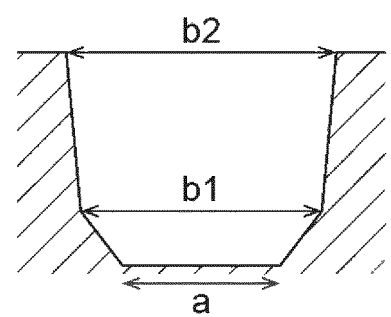
FIG. 24 is a cross-sectional view schematically illustrating another example of the cross-sectional shape of the recess of the base substrate.

Furthermore, the shape of the recess 62 in a cross-section perpendicular to the surface 60*a* may be, for example, shapes illustrated in FIG. 4. FIGS. 4(*a*) to 4(*h*) are cross-sectional views schematically illustrating examples of a cross-sectional shape of a recess of the base substrate. In all the cross-sectional shapes illustrated in FIGS. 4(*a*) to 4(*h*), the width (width b) of the opening of the recess 62 on the surface 60*a* is the maximum width in the cross-sectional shape. As such, the solder particle formed in the recess 62 is easily extracted, so that workability is improved. Furthermore, the shape of the recess 62 in a cross-section perpendicular to the surface 60*a* may be, for example, as illustrated in FIG. 24, shapes in which the wall surfaces in the cross-sectional shapes illustrated in FIGS. 4(*a*) to 4(*h*) are inclined. It can be said that FIG. 24 illustrates a shape in which the wall surface of the cross-sectional shape illustrated in FIG. 4(*b*) is inclined.

As a material constituting the base substrate 60, for example, inorganic materials such as silicon, various ceramic materials, glass, a metal such as stainless steel; and organic materials such as various resins can be used. Among these, the base substrate 60 is preferably formed of a material having heat resistance that is not transformed at a melting temperature of a solder fine particle. Furthermore, the recess 62 of the base substrate 60 can be formed by known methods such as a photolithographic method, an imprint method, and an etching method.

The solder fine particle to be prepared in the solder fine particle preparing step may include a fine particle having a particle diameter smaller than the width (width b) of the opening of the recess 62 on the surface 60*a*, and preferably includes a larger amount of fine particles having a particle diameter smaller than the width b. For example, as for the solder fine particles, the D10 particle diameter of the particle size distribution is preferably smaller than the width b, the D30 particle diameter of the particle size distribution is more preferably smaller than the width b, and the D50 particle diameter of the particle size distribution is further preferably smaller than the width b.

The particle size distribution of the solder fine particles can be measured using various methods suitable for sizes. For example, methods such as a dynamic light scattering method, a laser diffraction method, a centrifugal sedimentation method, an electrical sensing zone method, a resonance mass measurement method can be used. Further, a method of measuring a particle size from an image obtained with an optical microscope, an electronic microscope, or the like can be used. Specific examples of a device include a flow-type particle image analyzer, a Microtrac, and a Coulter counter.

The C.V. value of the solder fine particle to be prepared in the preparing step is not particularly limited, but from the viewpoint of improving the filling property of the solder fine particles in the recesses 62 by combination of small and large fine particles, the C.V. value is preferably high. For example, the C.V. value of the solder fine particle may exceed 20%, and is preferably 25% or more and more preferably 30% or more.

The C.V. value of the solder fine particle is calculated by multiplying a value, which is obtained by dividing the standard deviation of the particle diameter measured by the aforementioned method by the average particle diameter (D50 particle diameter), by 100.

The solder fine particle contains a tin-bismuth alloy (Sn—Bi alloy). Specific examples of the tin-bismuth alloy include the following examples.

Sn—Bi (Sn 43% by mass, Bi 57% by mass, melting point: 138° C.)

Sn—Bi (Sn 72% by mass, Bi 28% by mass, melting point: 138° C.)

Sn—Bi—Ag (Sn 42% by mass, Bi 57% by mass, Ag 1% by mass, melting point: 139° C.)

The solder fine particle may further contain metals other than Sn and Bi. Examples of the other metals include Ag, Cu, Ni, Bi, Zn, Pd, Pb, Au, P, B, Ga, As, Sb, Te, Ge, Si, and Al. The content rate of the other metal of the solder fine particle is, for example, 10% by mass or less, preferably 5% by mass or less, and more preferably 3% by mass or less.

In the accommodating step, the solder fine particles prepared in the solder fine particle preparing step are accommodated in the recesses 62 of the base substrate 60, respectively. The accommodating step may be a step of accommodating all the solder fine particles prepared in the solder fine particle preparing step in the recesses 62, or may be a step of accommodating some of solder fine particles prepared in the solder fine particle preparing step (for example, solder fine particles smaller than the width b of the opening of the recess 62 among the solder fine particles) in the recesses 62.

Figure 5:
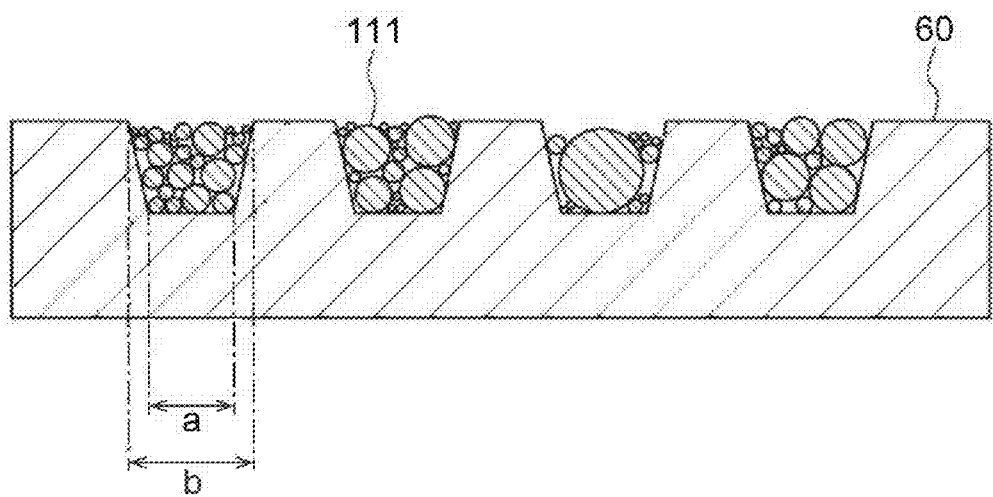
FIG. 5 is a cross-sectional view schematically illustrating a state where solder fine particles are accommodated in the recesses of the base substrate.

FIG. 5 is a cross-sectional view schematically illustrating a state where solder fine particles 111 are accommodated in the recess 62 of the base substrate 60. As illustrated in FIG. 5, a plurality of solder fine particles 111 are accommodated in the plurality of recesses 62, respectively.

The amount of the solder fine particles 111 accommodated in the recess 62 is, for example, preferably 20% or more, more preferably 30% or more, further preferably 50% or more, and most preferably 60% or more, with respect to the volume of the recess 62. As such, the variation in the accommodated amount is suppressed, and solder particles having a smaller particle size distribution are easily obtained.

A method for accommodating the solder fine particles in the recess 62 is not particularly limited. The accommodating method may be either a dry type or a wet type. For example, by disposing the solder fine particles prepared in the preparing step on the base substrate 60 and rubbing the surface 60*a* of the base substrate 60 using a squeegee, a sufficient amount of solder fine particles can be accommodated in the recess 62 while excessive solder fine particles are removed. In a case where the width b of the opening of the recess 62 is larger than the depth of the recess 62, the solder fine particles may protrude from the opening of the recess 62. When a squeegee is used, the solder fine particles protruding from the opening of the recess 62 are removed. Examples of a method for removing excessive solder fine particles also include methods such as blowing of compressed air and rubbing of the surface 60*a* of the base substrate 60 with a non-woven fabric or a fiber bundle. These methods are preferred in handling of solder fine particles that are easily transformed, since a physical force is weaker than a squeegee. Furthermore, in these methods, the solder fine particles protruding from the opening of the recess 62 can remain in the recess.

Figure 6:
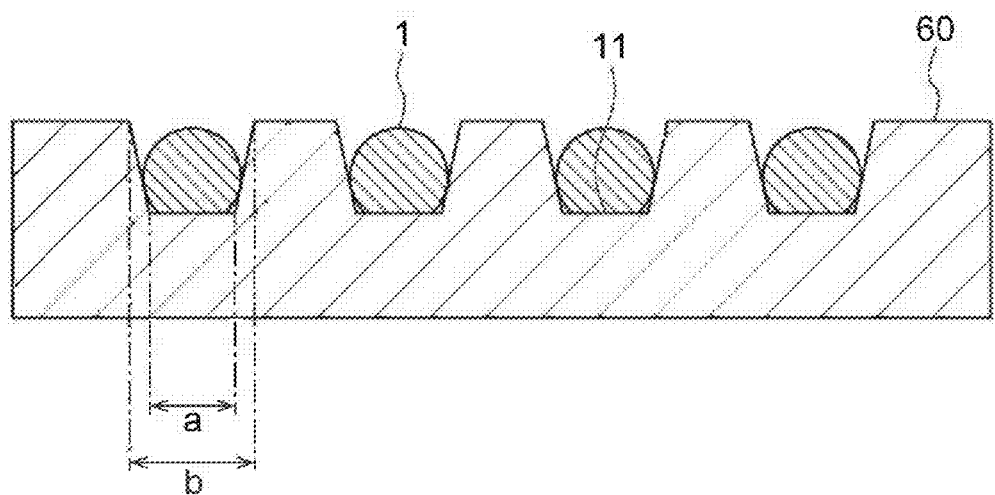
FIG. 6 is a cross-sectional view schematically illustrating a state where solder particles are formed in the recesses of the base substrate.

The fusing step is a step of fusing the solder fine particles 111 accommodated in the recess 62 to form a solder particle 1 inside the recess 62. FIG. 6 is a cross-sectional view schematically illustrating a state where the solder particles 1 are formed in the recesses 62 of the base substrate 60. The solder fine particles 111 accommodated in the recess 62 are melted to be aggregated and are spheroidized by surface tension. At this time, in a contact portion with the bottom portion 62*a* of the recess 62, the molten solder follows the bottom portion 62*a* to form the planar portion 11. As such, the solder particle 1 thus formed has a shape having the planar portion 11 on a part of the surface.

FIG. 7(*a*) is a view when the solder particle 1 is seen from a side opposite to an opening portion of the recess 62 in FIG. 6. The solder particle 1 has a shape in which a planar portion 11 having a diameter A is formed on a part of a surface of a sphere having a diameter B. Note that, the solder particle 1 illustrated in FIG. 6 and FIG. 7(*a*) has the planar portion 11 since the bottom portion 62a of the recess 62 has a planar surface, but in a case where the bottom portion 62a of the recess 62 has a shape other than the planar surface, the solder particle 1 has a surface having a different shape that corresponds to the shape of the bottom portion 62a.

Examples of a method for melting the solder fine particles 111 accommodated in the recess 62 include a method of heating the solder fine particles 111 to a melting point or higher of solder. The solder fine particles 111 are not melted, are not wetted and spread, or are not aggregated even when being heated at a temperature equal to or higher than the melting point of the solder particle due to the influence of an oxide film, in some cases. Therefore, the solder fine particle 111 is exposed to a reducing atmosphere to remove a surface oxide film of the solder fine particle 111, and then is heated at a temperature equal to or higher than the melting point of the solder fine particle 111, so that the solder fine particle 111 can be melted, wetted and spread, and aggregated. Furthermore, it is preferable to melt the solder fine particles 111 in a reducing atmosphere. When the solder fine particle 111 is heated to the melting point or higher of the solder fine particle 111 and in a reducing atmosphere, and the oxide film of the surface of the solder fine particle 111 is reduced, so that melting, wetting and spreading, and aggregation of the solder fine particle 111 is easy to effectively proceed.

A method for setting a reducing atmosphere is not particularly limited as long as it is a method by which the above-described effect is obtained, and for example, methods using hydrogen gas, hydrogen radical, formic acid gas, and the like are mentioned. For example, when a hydrogen reduction furnace, a hydrogen radical reduction furnace, a formic acid reduction furnace, or a conveyor furnace or continuous furnace of these, the solder fine particles 111 can be melted in a reducing atmosphere. These devices may include a heating device, a chamber in which inert gas (such as nitrogen or argon) is filled, a mechanism that vacuumizes the inside of the chamber, and the like in the furnace, thereby easily controlling reducing gas. Furthermore, when the inside of the chamber can be vacuumized, voids can be removed by depressurization after melting and aggregation of the solder fine particles 111, and the solder particle 1 further excellent in connection stability can be obtained.

Profiles such as reduction of the solder fine particles 111, melting conditions, temperature, atmosphere adjustment inside the furnace, and the like may be appropriately set in consideration of the melting point and particle size of the solder fine particle 111, the recess size, the material for the base substrate 60, and the like. For example, the solder particle 1 can be obtained as follows. The base substrate 60 in which the solder fine particles 111 are filled in the recess is inserted into a furnace, vacuuming is performed, reducing gas is then introduced to fill the reducing gas in the furnace, the surface oxide film of the solder fine particle 111 is removed, and then the reducing gas is removed by vacuuming. Thereafter, the base substrate 60 is heated to the melting point or higher of the solder fine particle 111 to melt and aggregate the solder fine particles, the solder particle is formed in the recess 62, and then the temperature in the furnace is returned to room temperature after the nitrogen gas is filled in the furnace. Furthermore, for example, the solder particle 1 can be obtained as follows. The base substrate 60 in which the solder fine particles 111 are filled in the recess is inserted into a furnace, vacuuming is performed, reducing gas is then introduced to fill the reducing gas in the furnace, the solder fine particles 111 are heated using a heating heater in the furnace, the surface oxide film of the solder fine particle 111 is removed, and then the reducing gas is removed by vacuuming. Thereafter, the base substrate 60 is heated to the melting point or higher of the solder fine particle 111 to melt and aggregate the solder fine particles, the solder particle is formed in the recess 62, and then the temperature in the furnace is returned to room temperature after the nitrogen gas is filled in the furnace. By heating the solder fine particles in a reducing atmosphere, there is an advantage that reduction power is increased, and the surface oxide film of the solder fine particle is easily removed.

Further, for example, the solder particle 1 can be obtained as follows. The base substrate 60 in which the solder fine particles 111 are filled in the recess is inserted into a furnace, vacuuming is performed, reducing gas is then introduced to fill the reducing gas in the furnace, the base substrate 60 is heated to the melting point or higher of the solder fine particle 111 using a heating heater in the furnace, the surface oxide film of the solder fine particle 111 is removed by reduction, and at the same time, the solder fine particles are melted and aggregated to form the solder particle in the recess 62, and the reducing gas is removed by vacuuming. Then, voids in the solder particle are reduced, and then the temperature in the furnace is returned to room temperature after the nitrogen gas is filled in the furnace. In this case, since it is sufficient to perform conditioning of each of increasing and decreasing of the temperature in the furnace once, there is an advantage that treatment is possible in a short time.

A step of forming the solder particle in the above-described recess 62, then setting the inside of the furnace to a reducing atmosphere once more, and removing a surface oxide film, which has not been removed, may be added. As such, residue such as solder fine particles remaining without being fused or a part of the oxide film remaining without being fused can be reduced.

In the case of using a conveyor furnace in an atmospheric pressure, the base substrate 60 in which the solder fine particles 111 are filled in the recess is placed on a conveyor for conveying, and the base substrate 60 is continuously passed through a plurality of zones, so that the solder particle 1 can be obtained. For example, the solder particle 1 can be obtained as follows. The base substrate 60 in which the solder fine particles 111 are filled in the recess is placed on a conveyor set at a constant speed and passed through a zone filled with inert gas, such as nitrogen or argon, at a temperature lower than the melting point of the solder fine particle 111. Subsequently, the base substrate 60 is passed through a zone in which reducing gas such as formic acid gas at a temperature lower than the melting point of the solder fine particle 111 is present, and the surface oxide film of the solder fine particle 111 is removed. Subsequently, the base substrate 60 is passed through a zone filled with inert gas, such as nitrogen or argon, at a temperature equal to or higher than the melting point of the solder fine particle 111 to melt and aggregate the solder fine particles 111, and subsequently, is passed through a cooling zone filled with inert gas such as nitrogen or argon. For example, the solder particle 1 can be obtained as follows. The base substrate 60 in which the solder fine particles 111 are filled in the recess is placed on a conveyor set at a constant speed and passed through a zone filled with inert gas, such as nitrogen or argon, at a temperature equal to or higher than the melting point of the solder fine particle 111. Subsequently, the base substrate 60 is passed through a zone in which reducing gas such as formic acid gas at a temperature equal to or higher than the melting point of the solder fine particle 111 is present, the surface oxide film of the solder fine particle 111 is removed to melt and aggregate the solder fine particles 111, and subsequently, the base substrate 60 is passed through a cooling zone filled with inert gas such as nitrogen or argon. Since the treatment in an atmospheric pressure can be performed in the above-described conveyor furnace, a film-shaped material can also be continuously treated by roll-to-roll. For example, a continuously rolled product of the base substrate 60 in which the solder fine particles 111 are filled in the recess is produced, a roll unwinding machine and a roll wind-up machine are installed at the inlet side of the conveyor furnace and the outlet side of the conveyor furnace, respectively. The base substrate 60 is conveyed at a constant speed and is passed through each zone in the conveyor furnace. Thus, the solder fine particles 111 filled in the recess can be fused.

Through the solder fine particle preparing step to the fusing step, the solder particle 1 having a uniform size can be formed regardless of the material and shape of the solder fine particle 111. Furthermore, since the formed solder particle 1 can be handled in a state of being accommodated in the recess 62 of the base substrate 60, transportation, storage, and the like are possible without the solder particle 1 being transformed. Further, since the formed solder particle 1 is merely in a state of being accommodated in the recess 62 of the base substrate 60, the solder particle 1 is easily extracted, and recovery, surface treatment, and the like can be performed without the solder particle being transformed.

Furthermore, the solder fine particle 111 may have an irregular shape even when variation in the particle size distribution is large, and can be suitably used as a raw material as long as it can be accommodated in the recess 62.

Furthermore, in the above-described method, the shape of the recess 62 of the base substrate 60 can be freely designed by lithography, machine processing, imprinting, etching, and the like. The size of the solder particle 1 depends on the amount of the solder fine particles 111 accommodated in the recess 62, so that the size of the solder particle 1 can be freely designed depending on the design of the recess 62.

The solder particle 1 formed in the fusing step may be used directly in the transferring step, may be used in the transferring step after the surface of the solder particle 1 is coated with a flux component in a state of being accommodated in the recess 62 of the base substrate 60, or may be used in the transferring step after the solder particle 1 is extracted from the recess 62, the surface thereof is coated with a flux component, and then the solder particle 1 is accommodated again in the recess 62. Note that, herein, although the base substrate 60 used for formation of the solder particle 1 is used directly in the transferring step, in the case of including a step of extracting the solder particle 1 from the recess 62, the extracted solder particle 1 may be accommodated in a base substrate different from the base substrate 60 and then may be used in the transferring step.

The transferring step is a step of bringing an insulating resin material 2a into contact with the base substrate 60 in a state where the solder particles 1 are accommodated in the recesses 62, from the opening side of the recess 62, to obtain a first resin layer 2b to which the solder particles 1 are transferred.

Figure 8A:
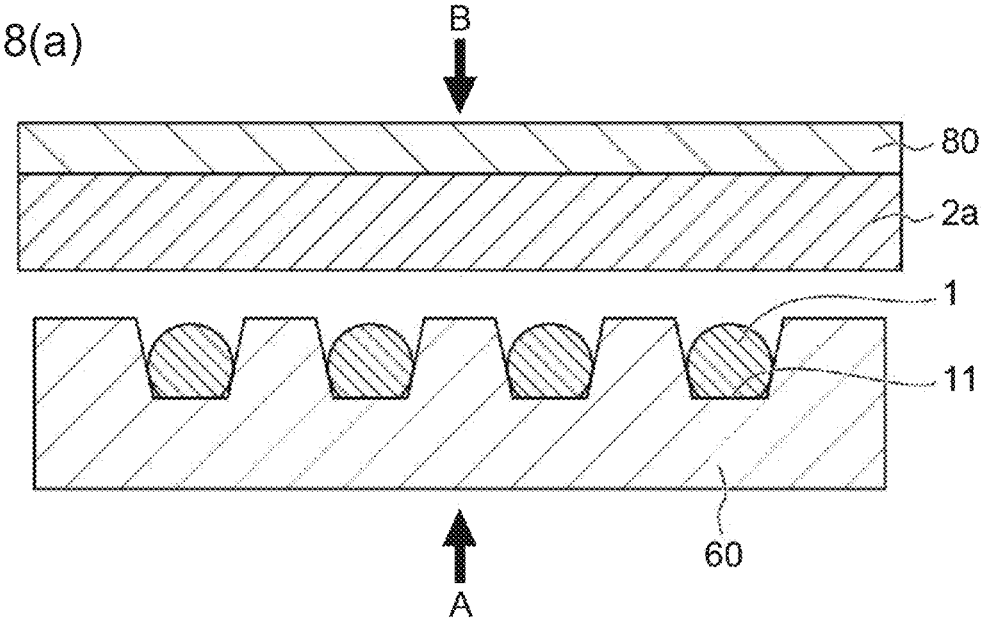
FIGS. 8(a) to 8(c) are cross-sectional views schematically illustrating examples of manufacturing processes of the anisotropically conductive film according to the first embodiment.

The base substrate 60 illustrated in FIG. 8(a) is in a state where one solder particle 1 is accommodated in each of the recesses 62. A layered insulating resin composition 2a is caused to face the surface of this base substrate 60 on the opening side of the recess 62, and the base substrate 60 and the layered insulating resin composition 2a are close to each other (arrows A and B in FIG. 8(a)). Note that, the layered insulating resin composition 2a is formed on a surface of a support 65. The support 65 may be a plastic film, or may be a metal foil.

Figure 8B:
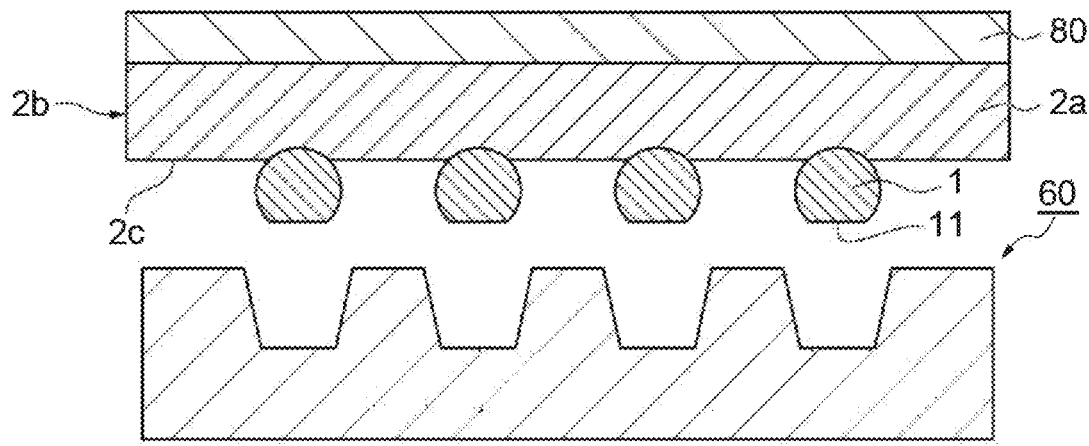

FIG. 8(b) illustrates a state after the transferring step, the state being a state where the surface of the base substrate 60 on the opening side of the recess 62 is brought into contact with the layered insulating resin composition 2a to transfer the solder particles 1 accommodated in the recesses 62 of the base substrate 60 to the layered insulating resin composition 2a. Through the transferring step, the first resin layer 2b is obtained in which the plurality of solder particles 1 are transferred to a predetermined position of the layered insulating resin composition 2a. In the first resin layer 2b, the plurality of solder particles 1 are exposed to the surface of the first resin layer 2b. Note that, in the above-described manufacturing method, the plurality of solder particles 1 are disposed in the anisotropically conductive film 10 in a state where the planar portion 11 faces a second resin layer 2d side in all the solder particles 1.

The laminating step is a step of forming the second resin layer 2d constituted by an insulating resin composition on a surface 2c of the first resin layer 2b on a side to which the solder particles 1 are transferred, to obtain the anisotropically conductive film 10.

Figure 8C:
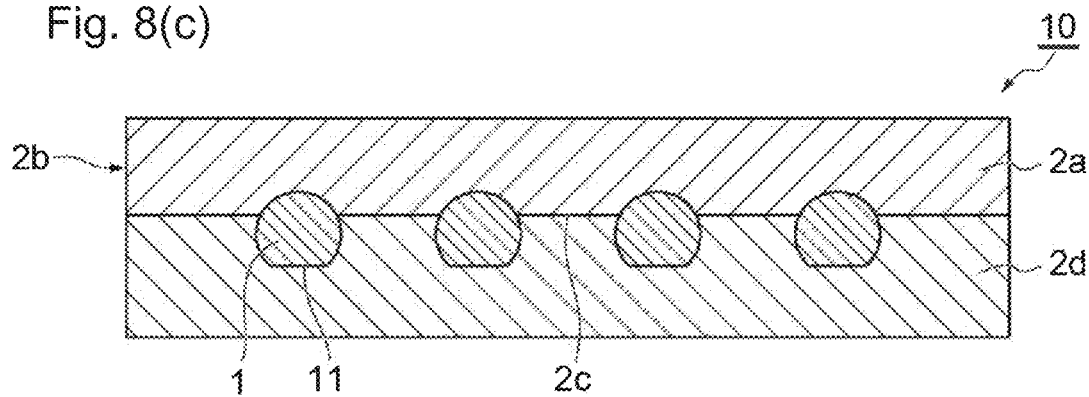

FIG. 8(c) illustrates a state after the laminating step, the state being a state where the second resin layer 2d is formed on the surface 2c of the first resin layer 2b to cover the solder particles 1, and then the support 65 is removed. The second resin layer 2d may be formed by laminating an insulating film made of an insulating resin composition on the first resin layer 2b, or may be formed by coating the first resin layer 2b with a varnish containing an insulating resin material and then performing a curing treatment.

Next, the method for manufacturing the anisotropically conductive film 10 according to a second embodiment will be described with reference to FIG. 9.

In the second embodiment, after the preparing step, the accommodating step, and the fusing step are performed in the same manner as in the first embodiment, in the transferring step, the solder particle 1 is buried in the first resin layer 2b by penetrating an insulating resin composition into the inside of the recess 62.

Figure 9A:
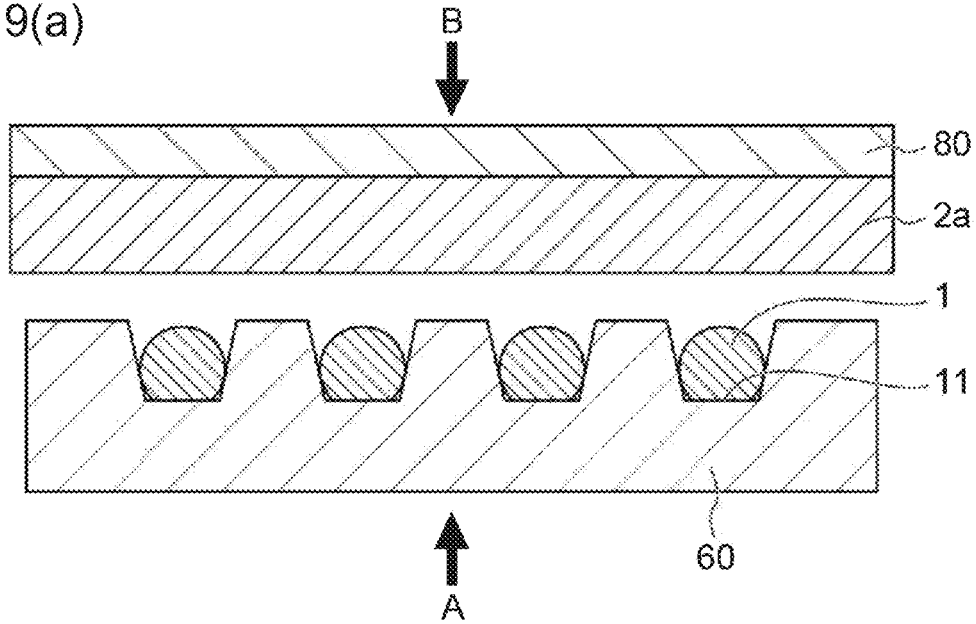
FIGS. 9(a) to 9(c) are cross-sectional views schematically illustrating examples of manufacturing processes of the anisotropically conductive film according to a second embodiment.

The base substrate 60 illustrated in FIG. 9(a) is in a state where one solder particle 1 is accommodated in each of the recesses 62. The layered insulating resin composition 2a is caused to face the surface of this base substrate 60 on the opening side of the recess 62, and the base substrate 60 and the layered insulating resin composition 2a are close to each other (arrows A and B in FIG. 9(a)).

Figure 9B:
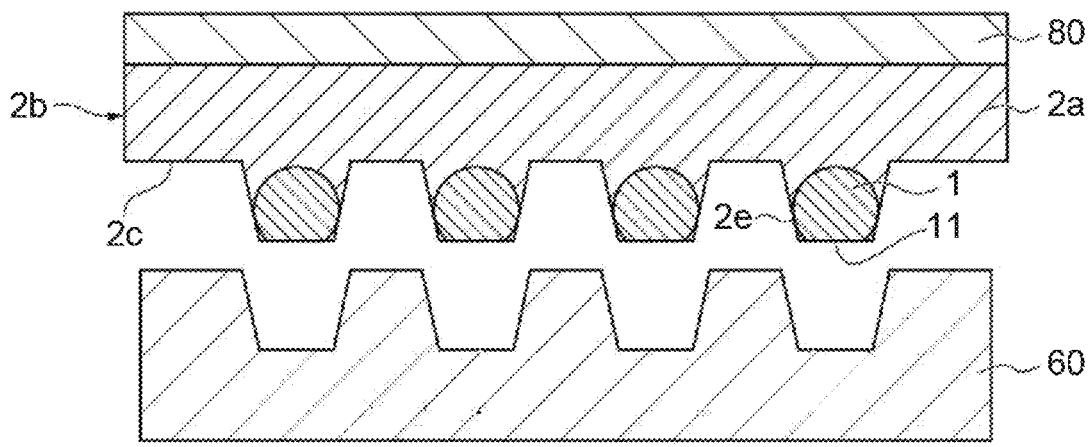

FIG. 9(b) illustrates a state after the transferring step, the state being a state where the surface of the base substrate 60 on the opening side of the recess 62 is brought into contact with the layered insulating resin composition 2a to transfer the solder particles 1 accommodated in the recesses 62 of the base substrate 60 to the layered insulating resin composition 2a. Through the transferring step, the first resin layer 2b is obtained in which the plurality of solder particles 1 are disposed at predetermined positions. A plurality of convex portions 2e corresponding to the recesses 62 are formed on the surface 2c of the first resin layer 2b, and the solder particles 1 are buried in these convex portions 2e. In order to obtain the first resin layer 2b as described above, in the transferring step, the insulating resin material 2a is penetrated into the inside of the recess 62. Specifically, the layered insulating resin composition 2a may be penetrated into the inside of the recess 62 by pressurizing the base substrate 60 and the layered insulating resin composition 2a in the lamination direction (directions of arrows A and B in FIG. 9(a)). Furthermore, when the transferring step is performed in a reduced-pressure atmosphere, the layered insulating resin composition 2a easily enters into the inside of the recess 62. Furthermore, although the transferring step is executed by the layered insulating resin material 2a in FIG. 9, the first resin layer 2b can also be obtained by applying an insulating resin composition in a varnish state to the inside of the recess 62 and the surface of the base substrate 60 and performing a curing treatment.

Figure 9C:
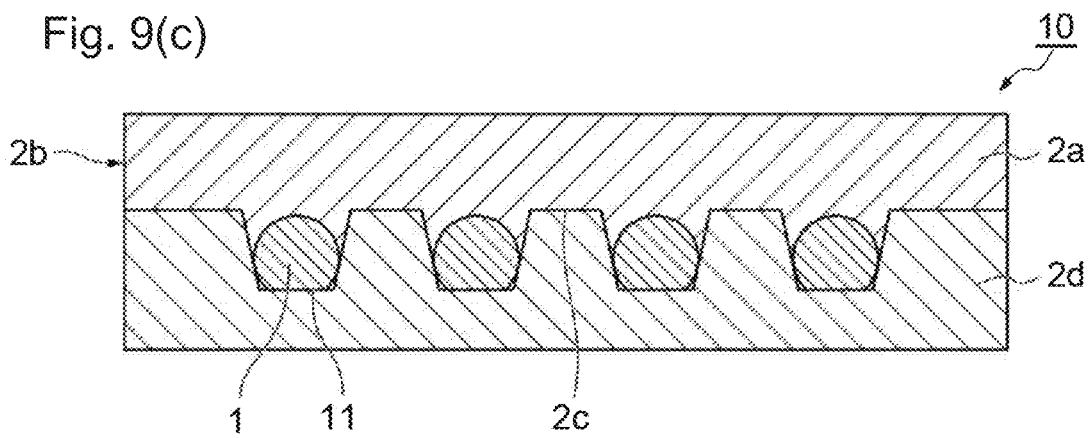

FIG. 9(c) illustrates a state after the laminating step, the state being a state where the second resin layer 2d is formed on the surface 2c of the first resin layer 2b, and then the support 65 is removed. The second resin layer 2d may be formed by laminating an insulating film made of an insulating resin composition on the first resin layer 2b, or may be formed by coating the first resin layer 2b with a varnish containing an insulating resin composition and then performing a curing treatment.

Figure 10A:
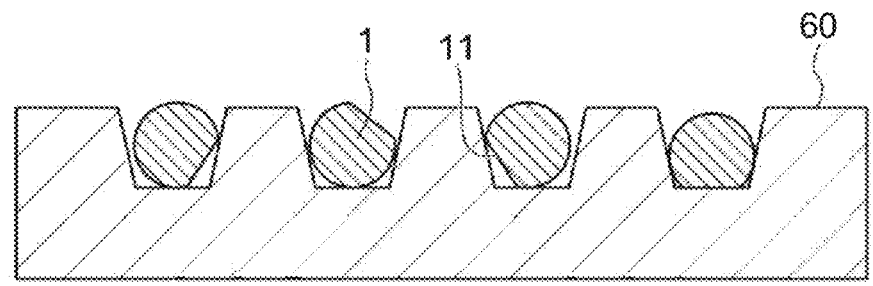
FIG. 10(a) and FIG. 10(b) are cross-sectional views schematically illustrating other examples of manufacturing processes of the anisotropically conductive film.
Figure 10B:
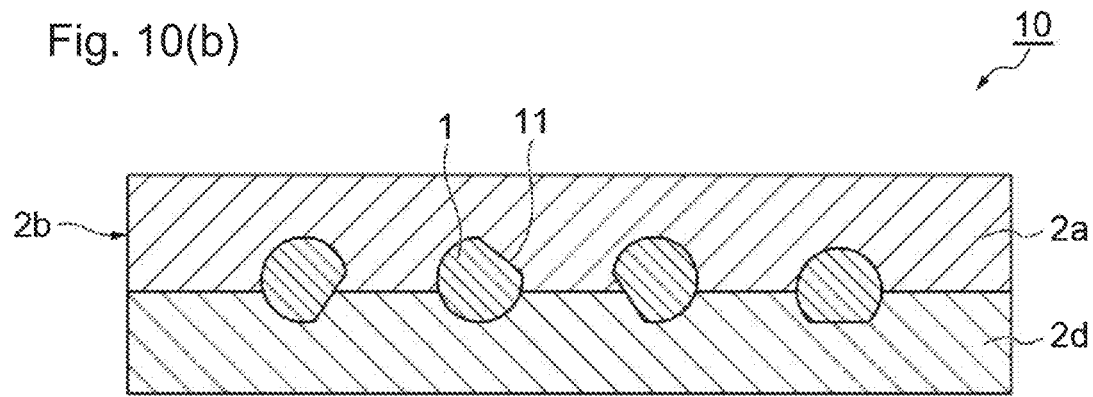

Note that, in the above-described manufacturing method, the plurality of solder particles 1 are disposed in the anisotropically conductive film 10 in a state where the planar portion 11 faces a second resin layer 2d side in all the solder particles 1. In the case of employing a method in which the solder particles 1 formed in the fusing step are extracted once, subjected to a treatment such as coating with a flux component, and disposed again in the recesses 62, in the plurality of solder particles 1, directions of the planar portions 11 may be different from each other. FIG. 10(a) illustrates a state where the solder particles 1 having been extracted once are disposed again in the recesses 62. By performing the transferring step and the laminating step in such a state, the plurality of solder particles 1 are disposed in the anisotropically conductive film 10 in a state where the directions of the planar portions 11 are not coincident with each other. FIG. 10(b) is a view illustrating a state where the plurality of solder particles 1 are disposed in the anisotropically conductive film 10 in a state where the directions of the planar portions 11 are not coincident with each other.

<Connection Structure>

Figure 11:
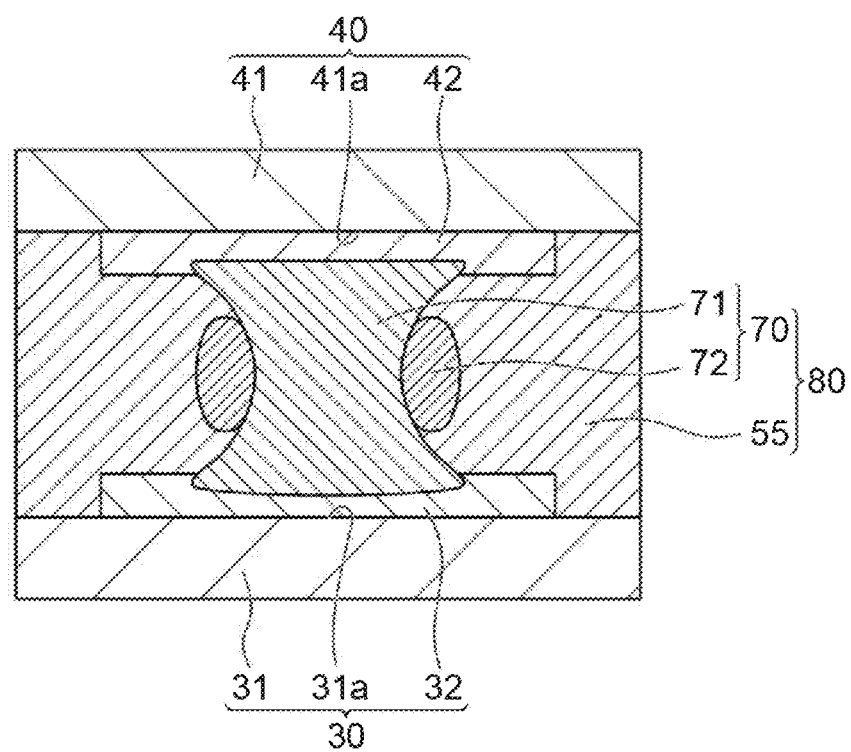
FIG. 11 is an enlarged view illustrating a part of a connection structure and cross-sectional view schematically illustrating a state where a first electrode and a second electrode are electrically connected by a bonding portion.

FIG. 11 is an enlarged view illustrating a part of a connection structure and cross-sectional view schematically illustrating a state where a first electrode and a second electrode are electrically connected by a bonding portion. That is, FIG. 11 schematically illustrates a state where an electrode 32 of a first circuit member 30 and an electrode 42 of a second circuit member 40 are electrically connected by a bonding portion 70 formed by fusing the solder particles 1. The term "fusing" in the present specification means, as described above, a state where at least a part of the electrode is bonded with the solder particle 1 melted by heat, and then the solder is bonded to the surface of the electrode through the step of solidifying the solder particle 1. The first circuit member 30 includes a first circuit board 31 and a first electrode 32 disposed on a surface 31a of the first circuit board 31. The second circuit member 40 includes a second circuit board 41 and a second electrode 42 disposed on a surface 41a of the second circuit board 41. An insulating resin layer 55 filled between the circuit members 30 and 40 maintains a state where the first circuit member 30 and the second circuit member 40 are attached and maintains a state where the first electrode 32 and the second electrode 42 are electrically connected.

Specific examples of one of the circuit members 30 and 40 include chip parts such as an IC chip (semiconductor chip), a resistor chip, a capacitor chip, and a driver IC; and a rigid package substrate. These circuit members include a circuit electrode, and generally include a plurality of circuit electrodes. Other specific examples of the other of the circuit members 30 and 40 include wiring substrates such as a flexible tape substrate having a metal wiring, a flexible printed circuit board, and a glass substrate with indium tin oxide (ITO) deposited.

Specific examples of the first electrode 32 or the second electrode 42 include copper, copper/nickel, copper/nickel/gold, copper/nickel/palladium, copper/nickel/palladium/gold, copper/nickel/gold, copper/palladium, copper/palladium/gold, copper/tin, copper/silver, and indium tin oxide electrodes. The first electrode 32 or the second electrode 42 can be formed by non-electrolytic plating, electrolytic plating, sputtering, or etching of a metal foil.

In the present embodiment, at least one of the first electrode 32 and the second electrode 42 is a gold electrode.

The bonding portion 70 includes a first region 71 connecting the first electrode 32 and the second electrode 42 and a second region 72 being in contact with the first region. In the present embodiment, it is considered that a part of gold in the gold electrode forms an alloy (tin-gold alloy) with tin in the solder by contact between the molten solder and the gold electrode and the first region 71 is formed. Furthermore, according to this, it is considered that bismuth in the solder is extruded from the first region 71 to form the second region 72 surrounding the circumference of the first region 71.

The first region 71 may be constituted by a tin-gold alloy, and the second region 72 may be constituted by bismuth.

A ratio $V_2/V_1$ of a volume $V_2$ of the second region 72 to a volume $V_1$ of the first region 71 may be, for example, 0.05 to 2.0, and is preferably 0.1 to 1.5 and more preferably 0.18 to 1.0.

The proportion of the bonding portion 70 including the first region 71 and the second region 72 among the plurality of bonding portions in the connection structure is 90% or more, preferably 95% or more, and more preferably 99% or more, and may be 100%. Note that, examples of a bonding portion not including the first region 71 and the second region 72 include a bonding portion having a columnar portion that is made of a tin-bismuth alloy.

FIG. 15(a), FIG. 15(b), FIG. 15(c), FIG. 15(d), FIG. 16(a), FIG. 16(b), FIG. 16(c), and FIG. 16(d) are cross-sectional views in a lamination direction schematically illustrating examples of a bonding portion including the first region 71 and the second region 72, respectively.

Figure 15A:
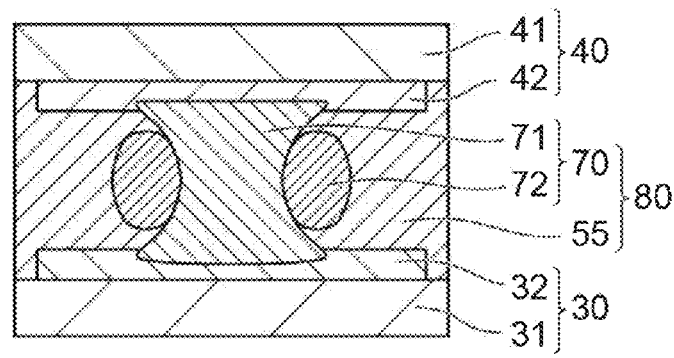
FIG. 15(a), FIG. 15(b), FIG. 15(c), and FIG. 15(d) are cross-sectional views schematically illustrating examples of a bonding portion including a first region and a second region, respectively.
Figure 17A:
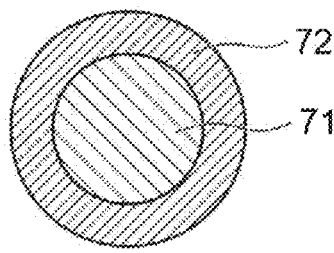
FIG. 17(a), FIG. 17(b), FIG. 17(c), FIG. 17(d), FIG. 17(e), and FIG. 17(f) are plan views schematically illustrating examples of the bonding portion including the first region and the second region, respectively.

As illustrated in FIG. 15(a), in the bonding portion 70, the first region 71 may have a columnar structure connecting the first electrode 32 and the second electrode 42, and the second region 72 may have an annular structure surrounding the first region 71. A cross-section of the bonding portion 70 illustrated in FIG. 15(a) perpendicular to the lamination direction may have, for example, a structure as illustrated in FIG. 17(a).

Figure 15B:
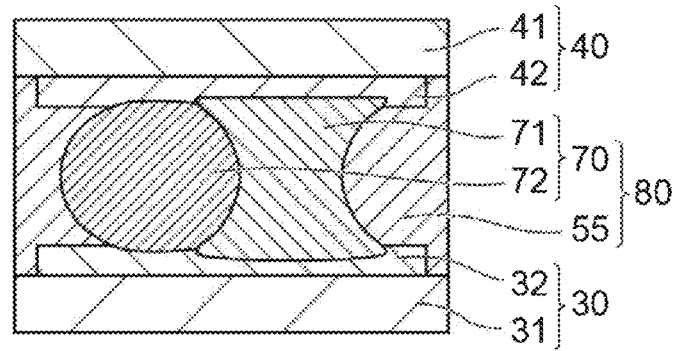
Figure 17B:
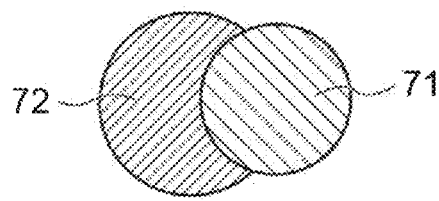

As illustrated in FIG. 15(b), in the bonding portion 70, the first region 71 may have a columnar structure connecting the first electrode 32 and the second electrode 42, and the second region 72 may have an agglomerated shape being in contact with a part of the first region 71. A cross-section of the bonding portion 70 illustrated in FIG. 15(b) perpendicular to the lamination direction may have, for example, a structure as illustrated in FIG. 17(b).

Figure 15C:
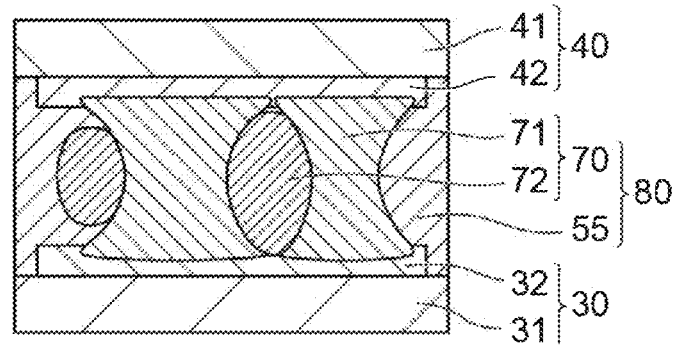
Figure 17C:
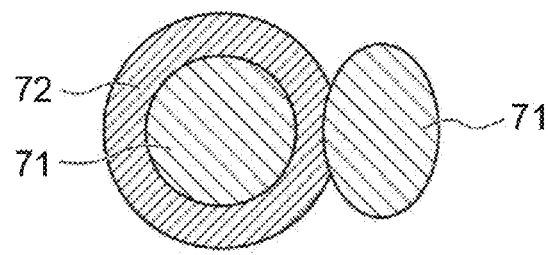

As illustrated in FIG. 15(c), the bonding portion 70 may have a plurality of first regions 71 that have a columnar structure connecting the first electrode 32 and the second electrode 42. Furthermore, in this bonding portion 70, the second region 72 may be disposed between a plurality of first regions 71 so as to connect the plurality of first regions 71 to each other. A cross-section of the bonding portion 70 illustrated in FIG. 15(c) perpendicular to the lamination direction may have, for example, a structure as illustrated in FIG. 17(c).

Figure 15D:
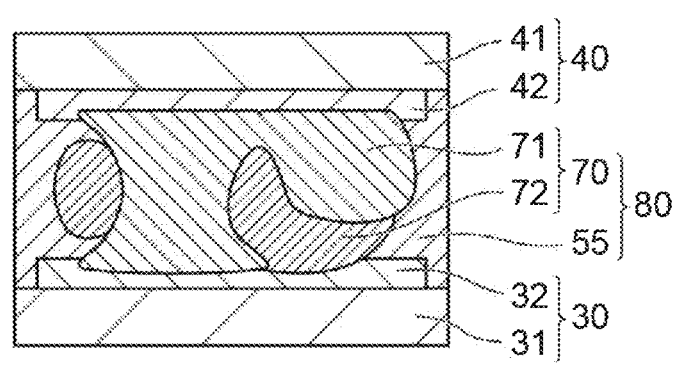
Figure 17D:
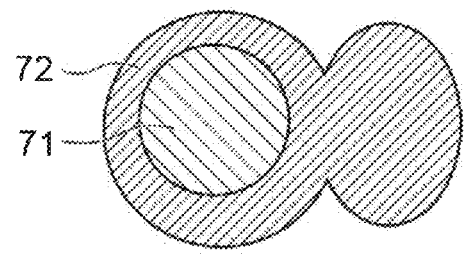

As illustrated in FIG. 15(d), in the bonding portion 70, the first region 71 may have a columnar structure connecting the first electrode 32 and the second electrode 42. Furthermore, the bonding portion 70 may further have an agglomerated body containing a tin-gold alloy other than the columnar structure. This agglomerated body may be integrated with the first region 71 as illustrated in FIG. 15(d) to constitute a part of the first region 71 (that is, the first region 71 may have a columnar portion and an agglomerated portion) and may exist to be spaced apart from the first region 71. In the former case, the second region 72 may be disposed to be in contact with the columnar portion or agglomerated portion of the first region 71, and in the latter case, the second region 72 may be disposed to be in contact with both of the first region 71 and the agglomerated body. A cross-section of the bonding portion 70 illustrated in FIG. 15(c) perpendicular to the lamination direction may have, for example, a structure as illustrated in FIG. 17(c) or FIG. 17(d).

Figure 16A:
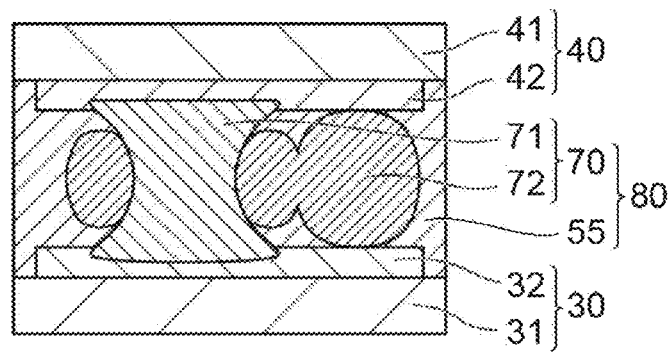
FIG. 16(a), FIG. 16(b), FIG. 16(c), and FIG. 16(d) are cross-sectional views schematically illustrating examples of the bonding portion including the first region and the second region, respectively.

As illustrated in FIG. 16(a), in the bonding portion 70, the first region 71 may have a columnar structure connecting the first electrode 32 and the second electrode 42, and the second region 72 may have an annular structure surrounding the first region 71. Furthermore, the bonding portion 70 may further have agglomerated body containing bismuth other than the annular structure. This agglomerated body may be integrated with the second region 72 as illustrated in FIG. 16(a) to constitute a part of the second region 72 (that is, the second region 72 may have an annular portion and an agglomerated portion), may be spaced apart from the second region 72 having an annular shape, and may be in contact with the first region 71 as another second region 72. A cross-section of the bonding portion 70 illustrated in FIG. 16(a) perpendicular to the lamination direction may have, for example, a structure as illustrated in FIG. 17(d).

Figure 16B:
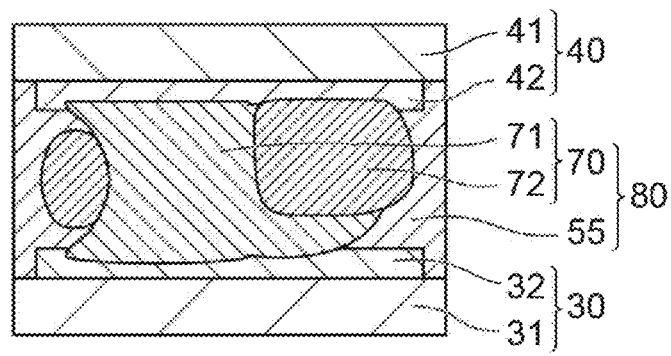

As illustrated in FIG. 16(b), in the bonding portion 70, the first region 71 may have a columnar structure connecting the first electrode 32 and the second electrode 42, and the second region 72 may have an annular structure surrounding a part of the first region 71. Furthermore, the first region 71 may spread along the electrode surface of the first electrode 32 or the second electrode 42.

Figure 16C:
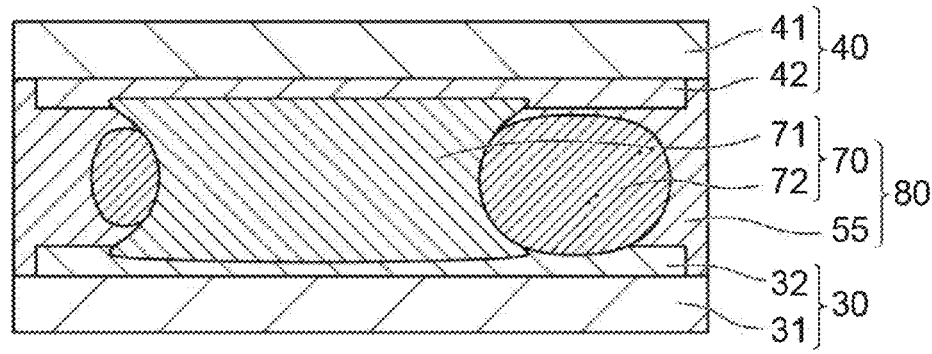
Figure 16D:
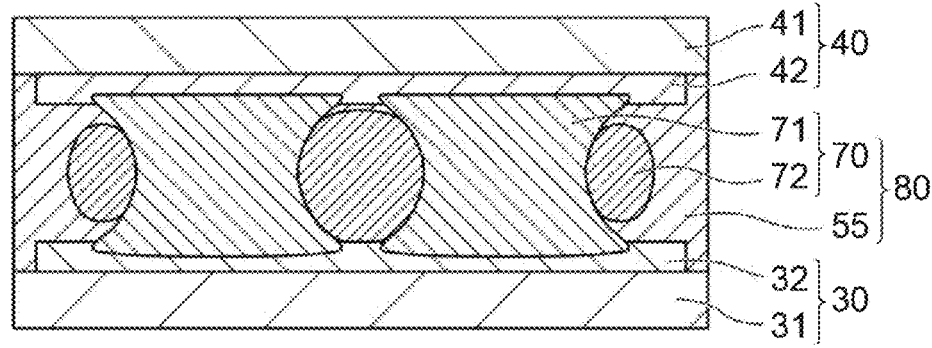
Figure 17E:
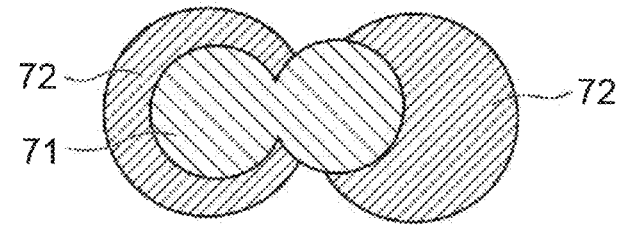
Figure 17F:
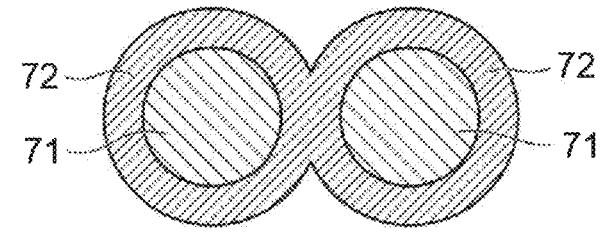

As illustrated in FIG. 16(c) or FIG. 16(d), the bonding portion 70 may be formed by aggregation of the plurality of solder particles 1 (or solder bumps). As illustrated in FIG. 16(c), the bonding portion 70 may include the first region 71 having a columnar structure that is formed by aggregation of the plurality of solder particles 1, and may further include the second region 72 having an annular shape that surrounds the first region 71. Furthermore, as illustrated in FIG. 16(d), the bonding portion 70 may have the plurality of first regions 71 each derived from the plurality of solder particles 1 (or solder bumps), and the plurality of first regions 71 may be connected by the second region 72. A cross-section of the bonding portion 70 illustrated in FIG. 16(c) perpendicular to the lamination direction may have, for example, a structure as illustrated in FIG. 17(e). Furthermore, a cross-section of the bonding portion 70 illustrated in FIG. 16(d) perpendicular to the lamination direction may have, for example, a structure as illustrated in FIG. 17(f).

Figure 18A:
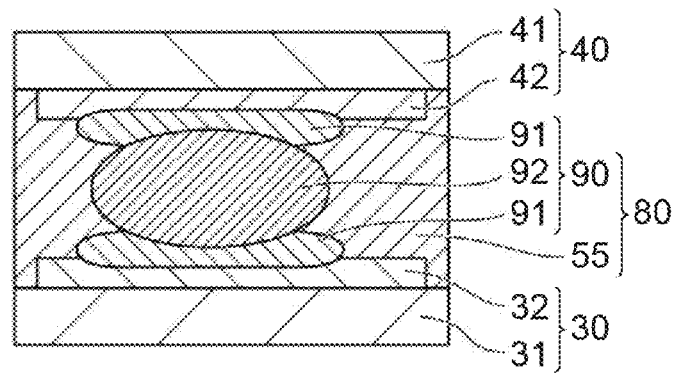
FIG. 18(a), FIG. 18(b), and FIG. 18(c) are cross-sectional views schematically illustrating examples of a bonding portion not including the first region and the second region, respectively.
Figure 18B:
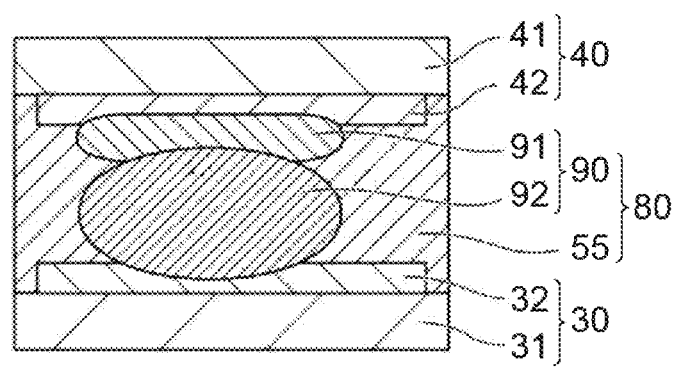
Figure 18C:
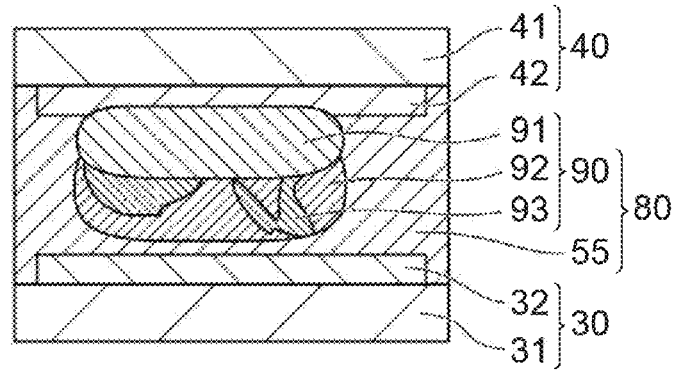

Next, FIG. 18(a), FIG. 18(b), and FIG. 18(c) are cross-sectional views in the lamination direction schematically illustrating examples of a bonding portion not including the first region and the second region, respectively.

Figure 19A:
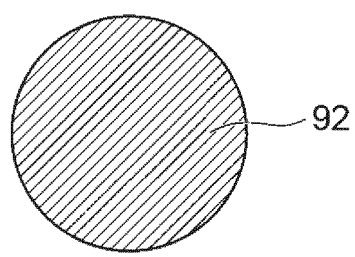
FIG. 19(a), FIG. 19(b), FIG. 19(c), and FIG. 19(d) are cross-sectional views schematically illustrating examples of the bonding portion not including the first region and the second region, respectively.
Figure 19B:
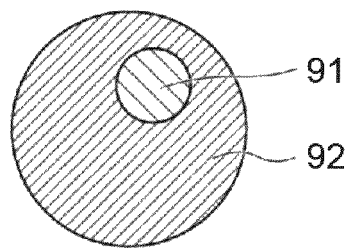
Figure 19C:
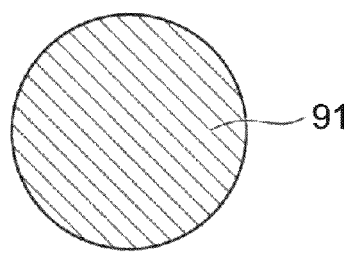
Figure 19D:
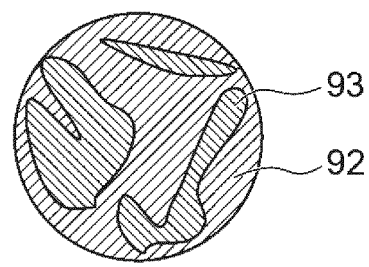
Figure 20:
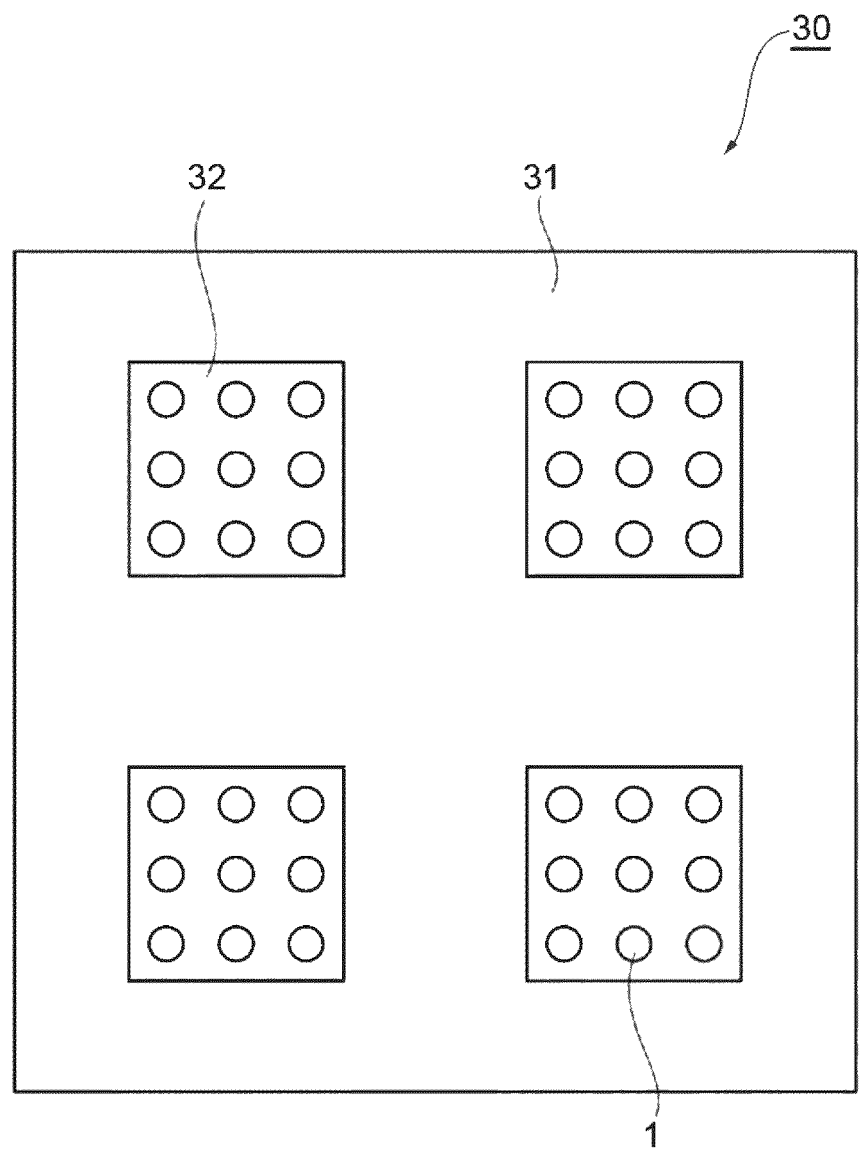
FIG. 20 is a plan view schematically illustrating a first example of a relation between a position of a solder particle in an anisotropically conductive film before pressing and heating and a position of a bump (electrode).
Figure 21:
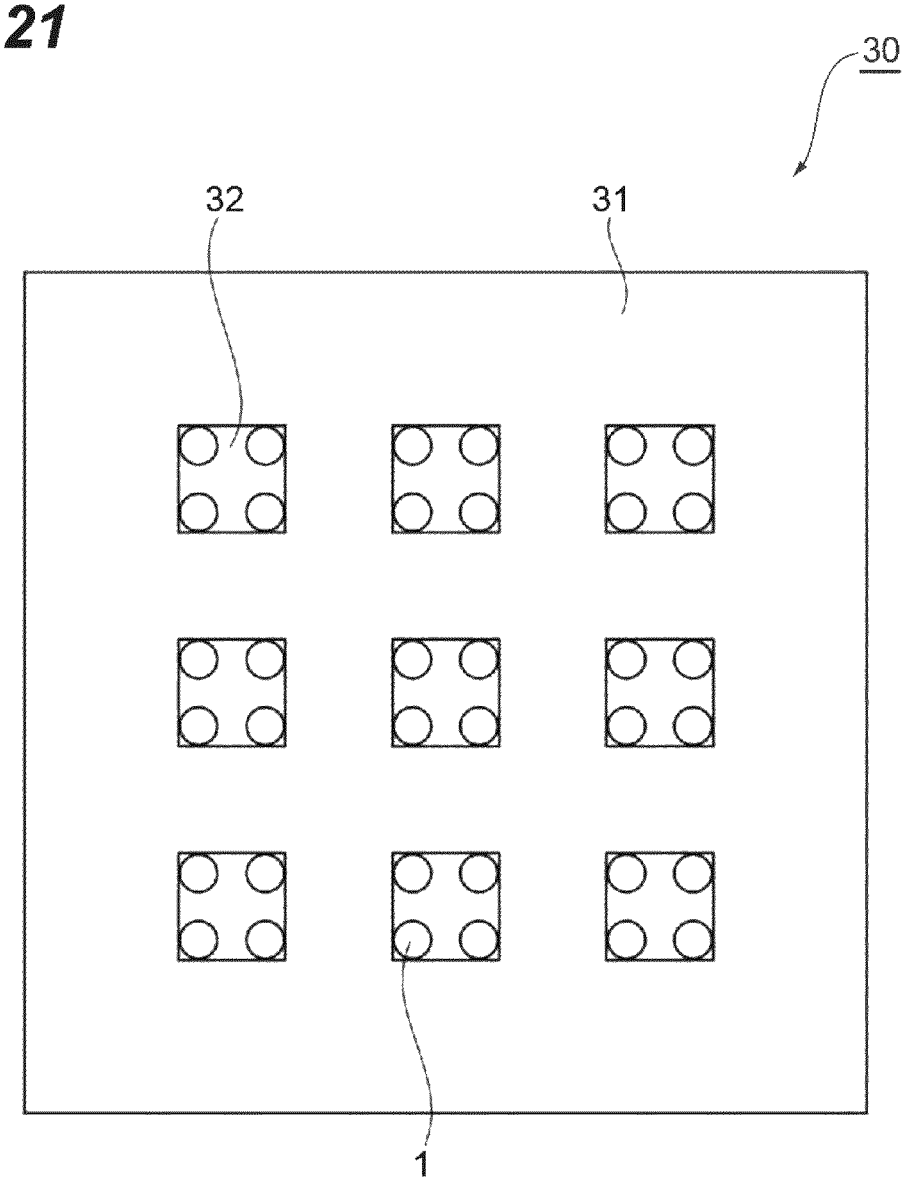
FIG. 21 is a plan view schematically illustrating a second example of the relation between a position of a solder particle in an anisotropically conductive film before pressing and heating and a position of a bump (electrode).
Figure 22:
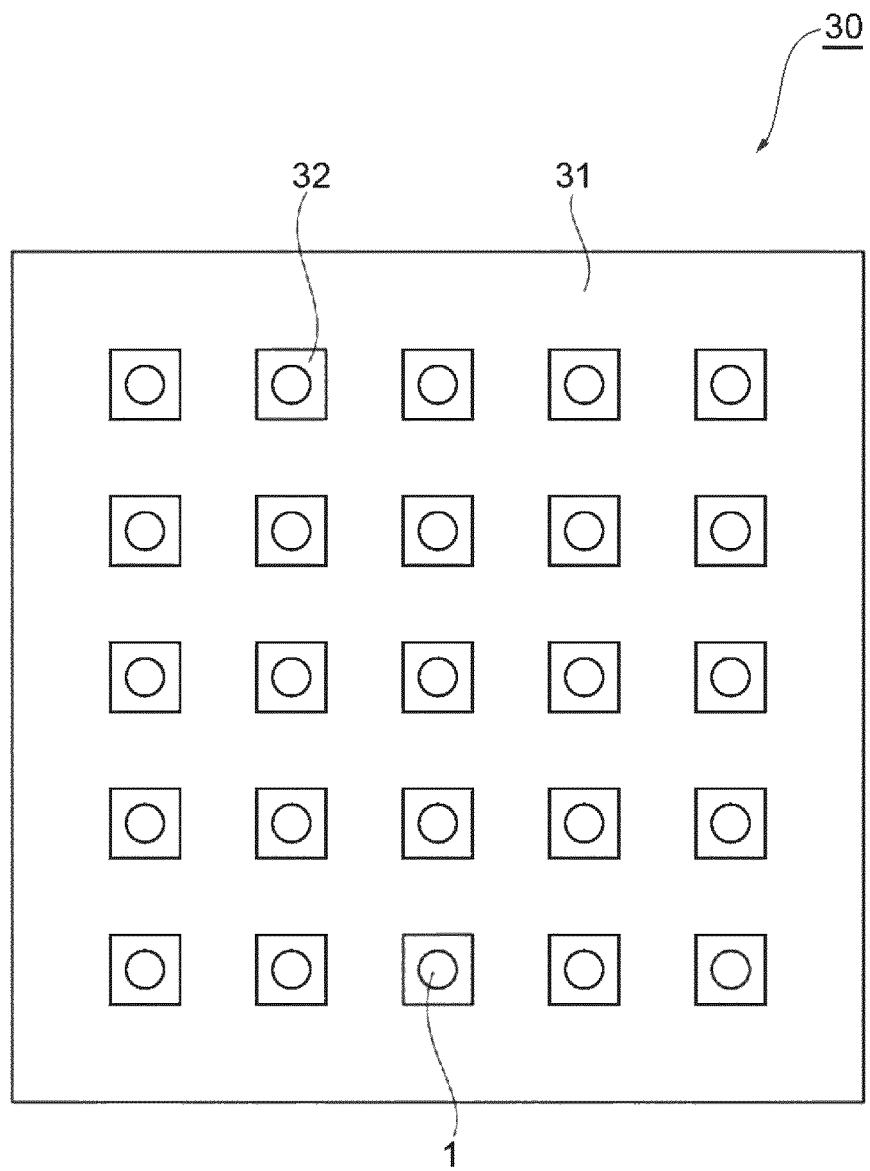
FIG. 22 is a plan view schematically illustrating a third example of the relation between a position of a solder particle in an anisotropically conductive film before pressing and heating and a position of a bump (electrode).
Figure 23:
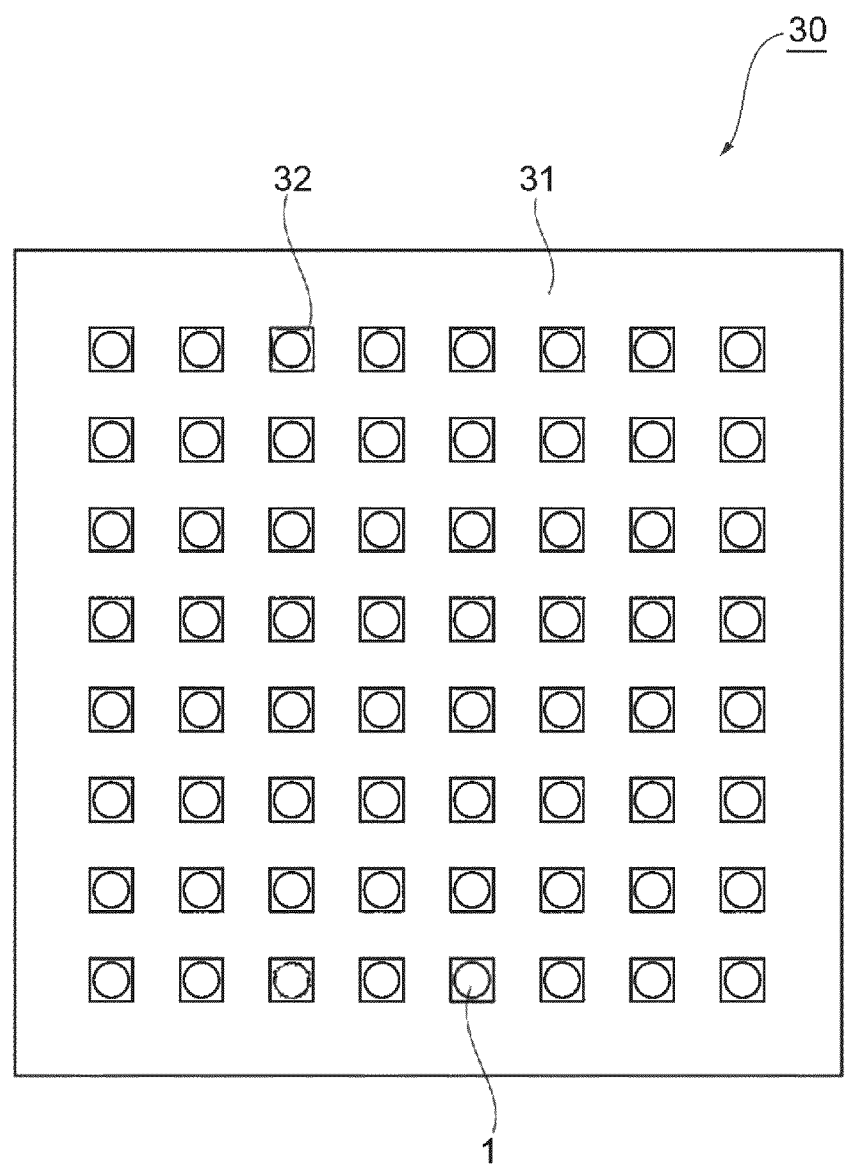
FIG. 23 is a plan view schematically illustrating a fourth example of the relation between a position of a solder particle in an anisotropically conductive film before pressing and heating and a bump (electrode).

In a bonding portion 90 illustrated in FIG. 18(a), a region 91 containing a tin-gold alloy is unevenly distributed on each of the first electrode 32 side and the second electrode 42 side, and the first electrode 32 and the second electrode 42 are not connected. Furthermore, a region 92 containing bismuth is formed between the region 91 on the first electrode 32 side and the region 91 on the second electrode 42 side. The bonding portion 90 illustrated in FIG. 18(a) does not include the first region and thus does not correspond to "the bonding portion including the first region and the second region". A cross-section of the bonding portion 90 illustrated in FIG. 18(a) perpendicular to the lamination direction may have, for example, a structure as illustrated in FIG. 19(a), FIG. 19(b), or FIG. 19(c).

In the bonding portion 90 illustrated in FIG. 18(b), the region 91 containing a tin-gold alloy is unevenly distributed on the second electrode 42 side, and the region 92 containing bismuth is formed between the region 91 and the first electrode 32. In the bonding portion 90 illustrated in FIG. 18(b), the region 91 does not connect the first electrode 32 and the second electrode 42, and the bonding portion 90 does not correspond to "the bonding portion including the first region and the second region". The cross-section of the bonding portion 90 illustrated in FIG. 18(a) perpendicular to the lamination direction may have, for example, a structure as illustrated in FIG. 19(a), FIG. 19(b), or FIG. 19(c).

In the bonding portion 90 illustrated in FIG. 18(c), the region 91 containing a tin-gold alloy and the region 92 containing a bismuth alloy are unevenly distributed on the second electrode 42 side, and the first electrode 32 and the second electrode 42 are not electrically connected. Furthermore, in the bonding portion 90 illustrated in FIG. 18(c), alloying of gold and tin is insufficient, and a region 93 containing tin is formed in the region 92. In the bonding portion 90 illustrated in FIG. 18(c), the region 91 does not connect the first electrode 32 and the second electrode 42, and the bonding portion 90 does not correspond to "the bonding portion including the first region and the second region". The cross-section of the bonding portion 90 illustrated in FIG. 18(a) perpendicular to the lamination direction may have, for example, a structure as illustrated in FIG. 19(a), FIG. 19(b), FIG. 19(c), or FIG. 19(d).

<Method for Manufacturing Connection Structure>

Figure 12A:
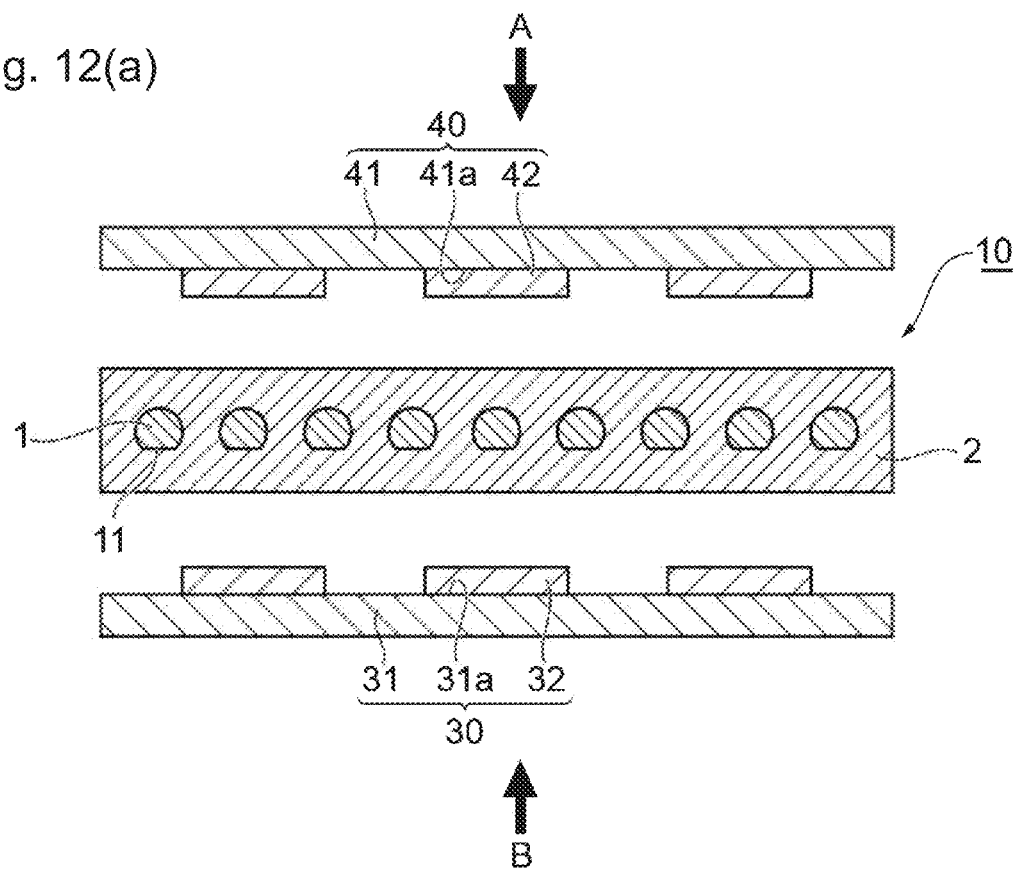
FIG. 12(a) and FIG. 12(b) are cross-sectional views schematically illustrating first examples of manufacturing processes of a connection structure according to the present invention.
Figure 12B:
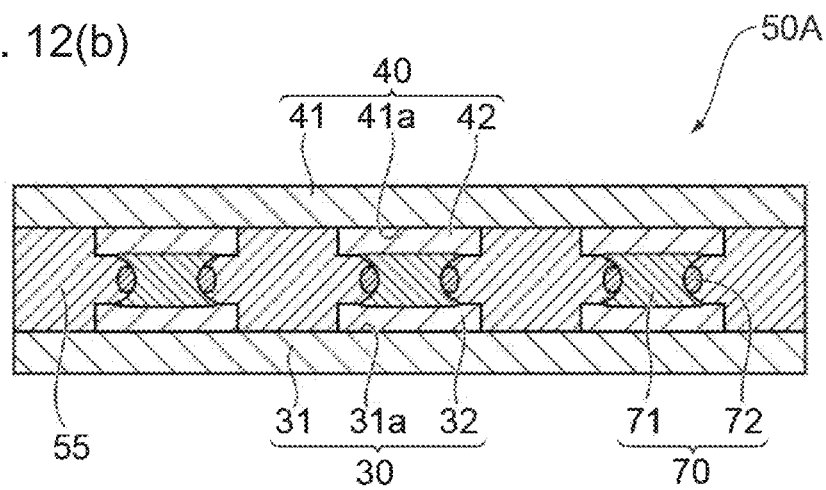

The method for manufacturing a connection structure will be described with reference to FIG. 12(a) and FIG. 12(b). These drawings are cross-sectional views schematically illustrating examples of processes of forming a connection structure 50A illustrated in FIG. 11. First, the anisotropically conductive film 10 illustrated in FIG. 1 is prepared in advance, and this film is disposed such that the first circuit member 30 and the second circuit member 40 face each other (FIG. 12(a)). At this time, the first electrode 32 of the first circuit member 30 and the second electrode 42 of the second circuit member 40 are provided to face each other. Thereafter, a pressure is applied in a thickness direction of a laminate of these members (directions of arrow A and arrow B illustrated in FIG. 12(a)). When a pressure is applied in directions of arrow A and arrow B, the entirety is subjected to at least heating at a temperature (for example, 130 to 260° C.) higher than the melting point of the solder particle 1, so that the solder particles 1 are melted and get together between the first electrode 32 and the second electrode 42 to form the bonding portion 70. Thereafter, the bonding portion 70 between the first electrode 32 and the second electrode 42 is fixed by cooling, and thus the first electrode 32 and the second electrode 42 are electrically connected.

In a case where the insulating resin composition constituting the insulating film 2 contains, for example, a thermosetting resin, when a pressure is applied in directions of arrow A and arrow B, the entirety is heated, so that the insulating resin composition can be cured. As such, the insulating resin layer 55 made of a cured product of the insulating resin composition is formed between the circuit members 30 and 40.

Figure 13A:
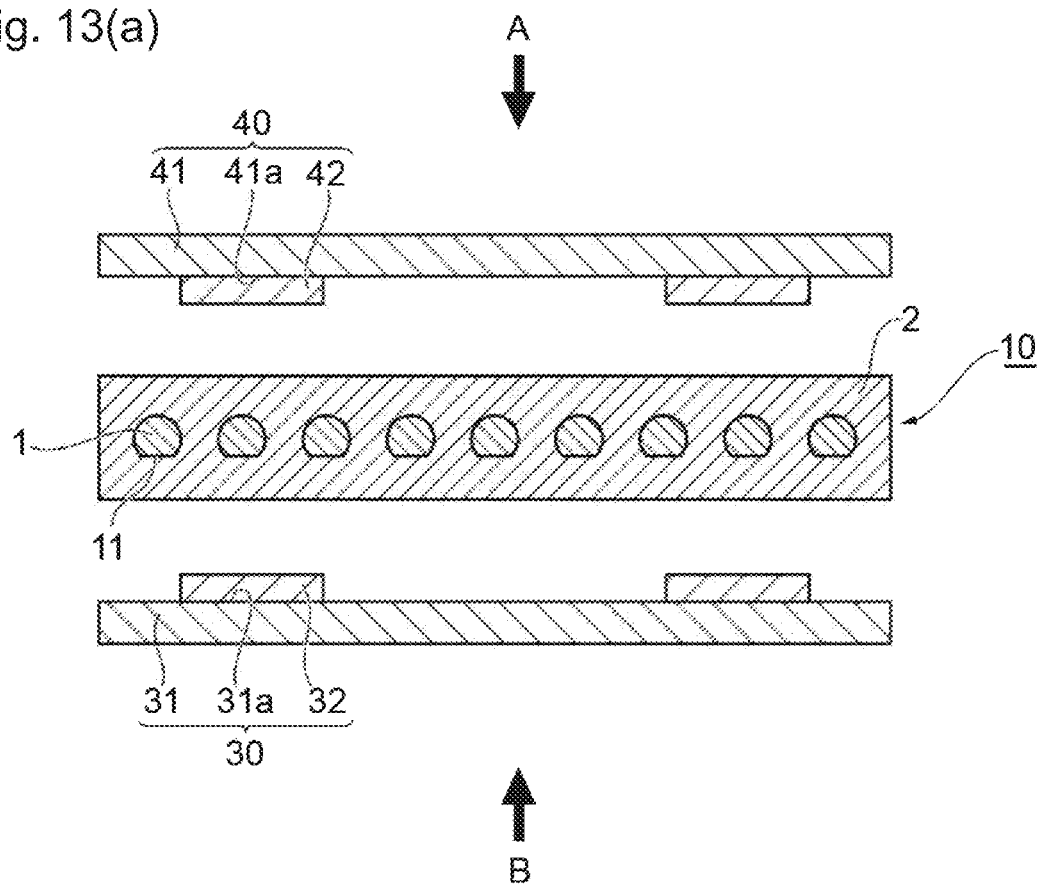
FIG. 13(a) and FIG. 13(b) are cross-sectional views schematically illustrating second examples of manufacturing processes of the connection structure according to the present invention.
Figure 13B:
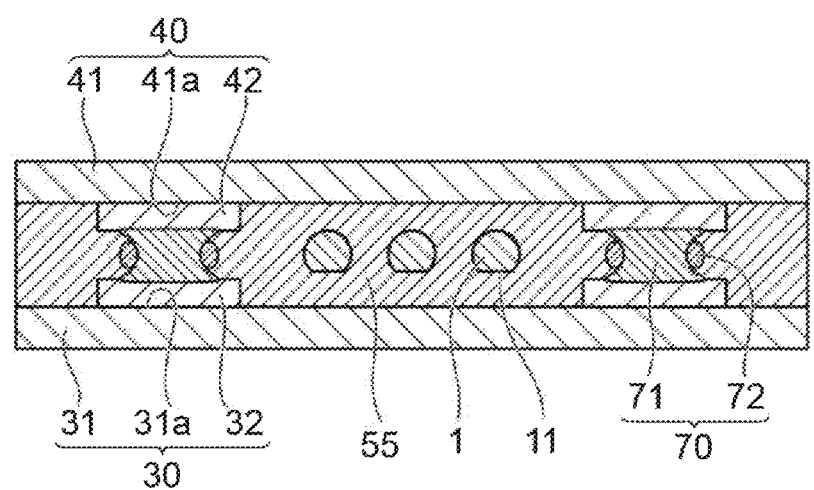

FIG. 13(*a*) and FIG. 13(*b*) are cross-sectional views schematically illustrating modification examples of a method for manufacturing the connection structure 50A illustrated in FIG. 12(*a*) and FIG. 12(*b*). In the manufacturing method according to this modification example, although some of the solder particles 1 do not contribute to fusing of the electrodes 32 and 42 but remain in the insulating resin layer 55, the solder particles 1 are merely disposed at specific positions in the anisotropically conductive film 10, that is, the density of the solder particles 1 is sufficiently low, so that insulation reliability can be maintained high.

Figure 14A:
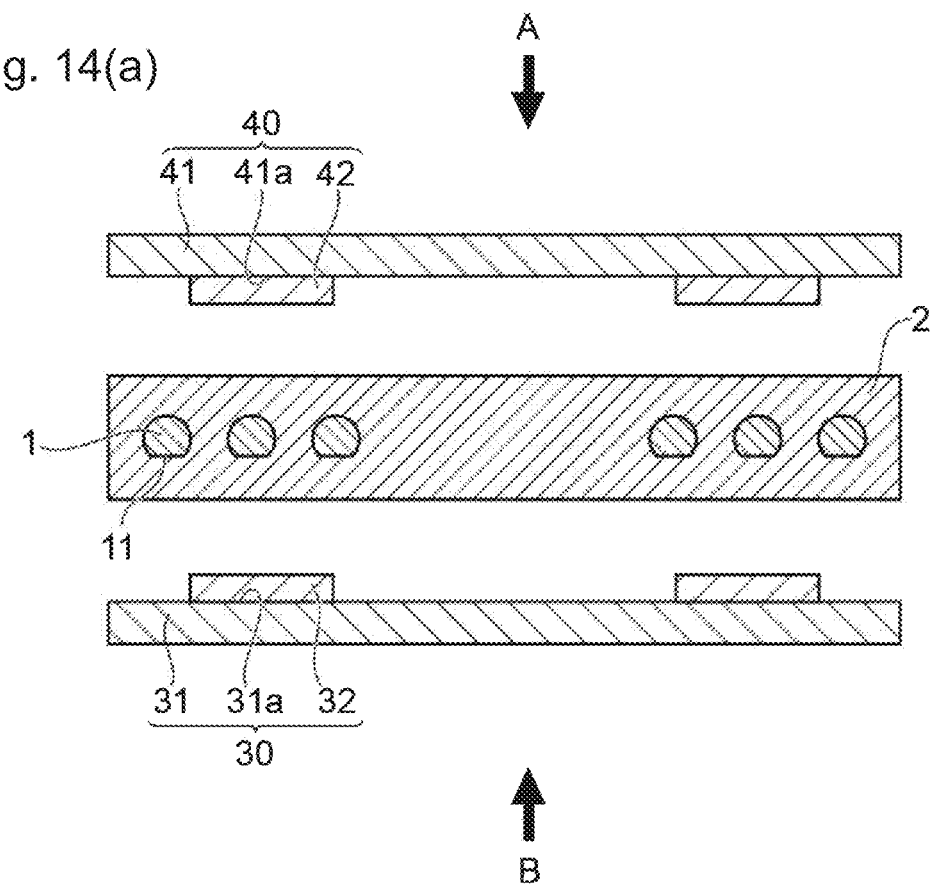
FIG. 14(a) and FIG. 14(b) are cross-sectional views schematically illustrating third examples of manufacturing processes of the connection structure according to the present invention.
Figure 14B:
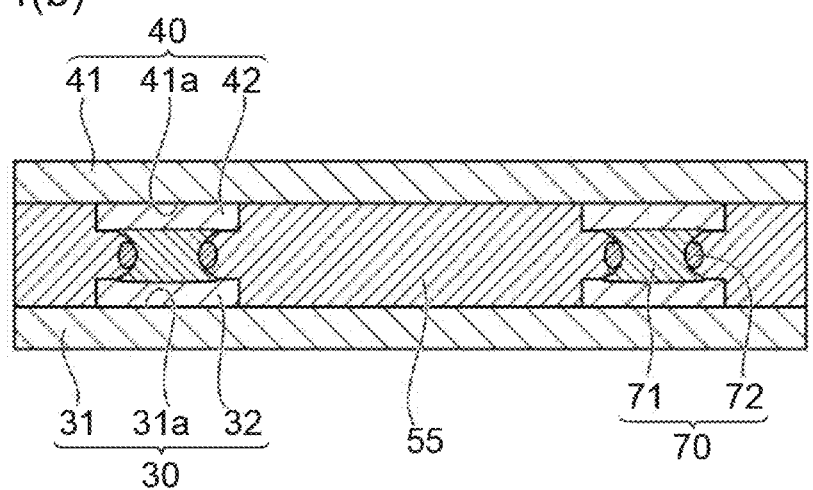

FIG. 14(*a*) and FIG. 14(*b*) are cross-sectional views schematically illustrating modification examples of the method for manufacturing the connection structure 50A illustrated in FIG. 12(*a*) and FIG. 12(*b*). In the manufacturing method according to this modification example, all of the solder particles 1 substantially become the bonding portions 70 and fuse the first electrode 32 of the first circuit member 30 and the second electrode 42 of the second circuit member 40. By designing the disposition of the solder particles 1 in the anisotropically conductive film 10 in advance, the solder particles 1 that do not contribute to fusing but remain can be reduced as much as possible. As such, the insulation reliability of the connection structure can be further improved.

Hereinbefore, the method for manufacturing the connection structure of the present embodiment using the anisotropically conductive film 10 has been described, but the connection structure of the present embodiment may be manufactured by a method not using an anisotropically conductive film.

For example, in another embodiment of the method for manufacturing a connection structure of the present embodiment, the bonding portion 70 may be manufactured by forming a solder bump on the surface of the first electrode 32 of the first circuit member 30 (or the second electrode 42 of the second circuit member 40), disposing the first electrode 32 (or the second electrode 42) on which the solder bump has been formed and the second electrode 42 (or the first electrode 32) at facing positions, and performing heating and pressurization to connect the first electrode 32 and the second electrode 42.

A method for forming solder bumps is not particularly limited, but a solder bump can be formed on the surface of the first electrode 32, for example, by preparing the base substrate 60 in which the solder particle 1 is accommodated in each of the recesses 62, disposing the first electrode 32 of the first circuit member 30 to face the surface of the base substrate 60 on the opening side of the recess 62, and performing a heating treatment while a pressure is applied in a thickness direction of the base substrate. A solder bump can also be formed on the surface of the second electrode 42 by the same method.

The heating treatment is preferably performed, for example, in a deoxidizing atmosphere or a reducing atmosphere. As such, oxidation of solder particles is suppressed, wetting and spreading of solder particles to the first electrodes 32 (or the second electrodes 42) are easy to proceed, and thus solder bumps can be more surely disposed on the surfaces of the first electrodes 32 (or the second electrodes 42). The deoxidizing atmosphere may be, for example, an inert gas atmosphere such as nitrogen or argon, a vacuum state, and the like.

From the viewpoint of more surely disposing solder bumps on the surfaces of the first electrodes 32 (or the second electrodes 42), a flux, a viscous substance, and the like may be used in the formation of solder bumps. Furthermore, since these materials may inhibit connection between the first electrode 32 and the second electrode 42 or may oxidize or corrode a solder bump or an electrode, a step of removing these materials may be provided after the formation of bumps.

The connection between the first electrode 32 and the second electrode 42 is preferably performed, for example, in a deoxidizing atmosphere or a reducing atmosphere. As such, oxidation of solder particles is suppressed, wetting and spreading of solder particles to the first electrodes 32 and the second electrodes 42 are easy to proceed, and thus the bonding portion 70 connecting the first electrode 32 and the second electrode 42 can be more surely formed. The deoxidizing atmosphere may be, for example, an inert gas atmosphere such as nitrogen or argon, a vacuum state, and the like.

From the viewpoint of more surely manufacturing the first electrode 32 and the second electrode 42, a flux, a viscous substance, and the like may be used in the formation of the bonding portion 70. Furthermore, since these materials oxidize or corrode a bonding portion or an electrode or may adversely affect the formation of the insulating resin layer 55 described below, a step of removing these materials may be provided after the formation of the bonding portion 70.

In the above-described embodiment of the method for manufacturing a connection structure, after the formation of the bonding portion 70, an insulating resin material may be injected between the first circuit member 30 and the second circuit member 40 and cured to form the insulating resin layer 55.

In the above-described embodiment of the method for manufacturing a connection structure, in the formation of the bonding portion 70, the first circuit member 30 having the first electrode 32 on which a solder bump is formed and the second circuit member 40 having the second electrode 42 are disposed such that the first electrode 32 and the second electrode 42 face each other, and an insulating resin film is further disposed between the first circuit member 30 and the second circuit member 40 and subjected to a heating treatment while a pressure is applied in the thickness direction. Thus, the formation of the bonding portion 70 and the formation of the insulating resin layer 55 can also be simultaneously performed.

FIG. 20, FIG. 21, FIG. 22, and FIG. 23 are views schematically illustrating a relation between a position of the solder particle 1 in the anisotropically conductive film 10 before pressing and heating and a position of the first electrode 32. It can also be considered that FIG. 20, FIG. 21, FIG. 22, and FIG. 23 are views schematically illustrating a relation between a position of the solder particle 1 in the base substrate 60 at the time of formation of solder bumps and a position of the first electrode 32 (or the second electrode 42).

Examples of targets to which the connection structures according to the above-described embodiments and modification examples thereof are applied include connecting of a semiconductor memory, a semiconductor logic chip, and the like, connecting portions of the first mounting and the second mounting of a semiconductor package, bonding bodies of a CMOS image element, a laser element, an LED light-emitting element, and the like, and devices such as a camera, a sensor, a liquid crystal display, a personal computer, a mobile phone, a smartphone, and a tablet that use these connecting portions and bonding bodies.

Hereinbefore, the preferred embodiments of the present invention have been described; however, the present invention is not limited to the above-described embodiments.

EXAMPLES

Hereinafter, the present invention will be more specifically described by means of Examples; however, the present invention is not limited to these Examples.

<Production of Solder Particle>

Production Example 1

(Step a1) Classification of Solder Fine Particles 100 g of Sn—Bi solder fine particles (manufactured by 5N Plus, melting point: 139° C., Type 8) were immersed in distilled water, subjected to dispersion under ultrasonication, and left to stand still, and solder fine particles floating in the supernatant were recovered. This operation was repeated and 10 g of solder fine particles were recovered. The obtained solder fine particle has an average particle diameter of 1.0 μm and a C.V. value of 42%.

(Step b1) Disposition on Base Substrate

A base substrate (polyimide film, thickness: 100 μm) having a plurality of recesses with an opening diameter of 2.3 μmϕ, a bottom portion diameter of 2.0 μmϕ, and a depth of 2.0 μm (the bottom portion diameter of 2.0 μmϕ is positioned at the center of the opening diameter of 2.3 μmϕ when the opening is viewed from the upper surface) as shown in Table 1 was prepared. The plurality of recesses were regularly arranged with an interval of 1.0 μm. The solder fine particles obtained in the step a (average particle diameter: 1.0 μm, C.V. value: 42%) were disposed in the recesses of the base substrate. Note that, excessive solder fine particles were removed by rubbing, with a low-adhesion roller, the surface side of the base substrate on which the recesses are formed, thereby obtaining the base substrate in which the solder fine particles are disposed only in the recesses.

(Step c1) Formation of Solder Particle

The base substrate in which the solder fine particles are disposed in the recesses in the step b1 was charged in a hydrogen radical reduction furnace (manufactured by SHINKO SEIKI CO., LTD., plasma reflow device), subjected to vacuuming, and then hydrogen gas was introduced into the furnace to fill the hydrogen gas in the furnace. Thereafter, the inside of the furnace was adjusted to 120° C. and irradiation with hydrogen radicals was performed for 5 minutes. Thereafter, after the hydrogen gas in the furnace was removed by vacuuming, the furnace was then heated to 170° C., nitrogen was introduced into the furnace, and the pressure in the furnace was returned to an atmospheric pressure, the temperature in the furnace was decreased to room temperature to form solder particles.

(Step d1) Recovery of Solder Particle

The solder particles were recovered from the recesses by tapping the base substrate obtained through the step c 1 from the back side of the recess. The obtained solder particles were evaluated by the following method.

<Evaluation of Solder Particle>

The obtained solder particles were placed on a conductive tape fixed to an SEM observation stage surface, and the solder particles were spread uniformly on the conductive tape by tapping the SEM observation stage on a stainless steel plate having a thickness of 5 mm. Thereafter, compressed nitrogen gas was blown to the conductive tape surface to fix the solder particles on the conductive tape in a single layer. The diameters of 300 solder particles were measured with an SEM to calculate an average particle diameter and a C.V. value. The results are shown in Table 2.

Production Examples 2 to 6

Solder particles were produced and evaluated in the same manner as in Production Example 1, except that the size of the recess was changed as described in Table 1. The results are shown in Table 2.

TABLE 1

|  |  | Production Example 1 | Production Example 2 | Production Example 3 | Production Example 4 | Production Example 5 | Production Example 6 |
|---|---|---|---|---|---|---|---|
| Opening diameter | μm | 2.3 | 4.3 | 6.3 | 18 | 24 | 30 |
| Bottom portion diameter | μm | 2 | 4 | 6 | 16 | 22 | 28 |
| Depth | μm | 2 | 4 | 6 | 16 | 22 | 28 |
| Interval | μm | 1 | 2.3 | 4.6 | 8.6 | 11.5 | 17 |

TABLE 2

|  |  | Production Example 1 | Production Example 2 | Production Example 3 | Production Example 4 | Production Example 5 | Production Example 6 |
|---|---|---|---|---|---|---|---|
| Average particle diameter | μm | 2.0 | 3.9 | 6.0 | 16.0 | 21.8 | 28.1 |
| C.V. value | % | 18.8 | 7.6 | 6.5 | 4.1 | 3.7 | 3.1 |

Example 1

(A) Production of Anisotropically Conductive Film (Step e1) Manufacturing of Flux-Coated Solder Particles Solder particles were produced by the same method as in Production Example 1. 20 g of the obtained solder particles, 4 g of adipic acid, and 7 g of acetone were weighed in a three-necked flask, 0.03 g of dibutyltin oxide catalyzing a dehydration condensation reaction between a hydroxyl group on the solder particle surface and a carboxyl group of adipic acid was then added, and the resultant product was reacted at 60° C. for 4 hours. Thereafter, the solder particles were recovered by filtration. The recovered solder particles, 5 g of adipic acid, 20 g of toluene, and 0.03 g of para-toluene sulfonic acid were weighed in a three-necked flask and reacted at 120° C. for 3 hours while performing vacuuming and reflux. At this time, reaction was performed using a Dean-Stark extraction apparatus while the generated water was removed by dehydration condensation. Thereafter, the solder particles were recovered by filtration, washed with hexane, and dried. The dried solder particles were crushed with an airflow crusher and passed through a mesh by a sound wave sieve to obtain flux-coated solder particles.

(Step f1) Disposition of Flux-Coated Solder Particles

A transfer mold (polyimide film, thickness: 100 μm) having a plurality of recesses with an opening diameter of 2.3 μmφ, a bottom portion diameter of 2.0 μmφ, and a depth of 2.0 μm (the bottom portion diameter of 2.0 μmφ is positioned at the center of the opening diameter of 2.3 μmφ when the opening portion is viewed from the upper surface) was prepared. Note that, the plurality of recesses were regularly arranged with an interval of 1.0 μm. The flux-coated solder particles obtained in the step e1 were disposed in the recesses of this transfer mold, respectively.

(Step g1) Production of Adhesive Film 100 g of a phenoxy resin (manufactured by Union Carbide Corporation, trade name "PKHC") and 75 g of acrylic rubber (copolymer of 40 parts by mass of butyl acrylate, 30 parts by mass of ethyl acrylate, 30 parts by mass of acrylonitrile, 3 parts by mass of glycidyl methacrylate, molecular weight: 850000) were dissolved in 400 g of ethyl acetate to obtain a solution. 300 g of a liquid epoxy resin containing a microcapsule-type latent curing agent (epoxy equivalent: 185, manufactured by Asahi Kasei Epoxy Co., Ltd., trade name "NOVACURE HX-3941") was added to this solution and stirred to obtain an adhesive solution. The obtained adhesive solution was applied to a separator (silicone-treated polyethylene terephthalate film, thickness: 40 μm) using a roll coater and heated at 90° C. for 10 minutes to be dried, thereby producing adhesive films (insulating resin films) having thicknesses of 2, 3, 4, 10, 15, and 20 μm on the separator.

(Step h1) Transferring of Flux-Coated Solder Particles

The adhesive film formed on the separator and the transfer mold on which the flux-coated solder particles were disposed in the step f1 were disposed to face each other, thereby transferring the flux-coated solder particles to the adhesive film.

(Step i1) Production of Anisotropically Conductive Film

An adhesive film produced by the same method as in the step g1 was brought into contact with the transfer surface of the adhesive film obtained in the step h1 and then heated and pressurized at 50° C. and 0.1 MPa (1 kgf/cm$^2$), thereby obtaining an anisotropically conductive film in which flux-coated solder particles were arranged in a layer shape in cross-sectional view of the film. Note that, a 2-μm film overlapped a film having a thickness of 2 μm, and similarly, 3-μm, 4-μm, 10-μm, 15-μm, and 20-μm films overlapped films having thicknesses of 3 μm, 4 μm, 10 μm, 15 μm, and 20 μm, respectively, thereby producing anisotropically conductive films having thicknesses of 4 μm, 6 μm, 8 μm, 20 μm, 30 μm, and 40 μm.

(B) Production of Connection Structure (Step j1) Preparation of Evaluation Chip

Seven kinds of chips provided with gold bumps (3.0×3.0 mm, thickness: 0.5 mm) described below were prepared.

Chip C1 . . . area: 100 μm×100 μm, space: 40 μm, height: 10 μm, number of bumps: 362

Chip C2 . . . area: 75 μm×75 μm, space: 20 μm, height: 10 μm, number of bumps: 362

Chip C3 . . . area: 40 μm×40 μm, space: 16 μm, height: 7 μm, number of bumps: 362

Chip C4 . . . area: 30 μm×30 μm, space: 12 μm, height: 6 μm, number of bumps: 362

Chip C5 . . . area: 20 μm×20 μm, space: 7 μm, height: 5 μm, number of bumps: 362

Chip C6 . . . area: 10 μm×10 μm, space: 6 μm, height: 3 μm, number of bumps: 362

(Step k1) Preparation of Evaluation Substrate

Seven kinds of substrates provided with gold bumps (70×25 mm, thickness: 0.5 mm) described below were prepared. Note that, lead-out wires for resistance measurement are formed on these gold bumps.

Substrate D1 . . . area: 100 μm×100 μm, space: 40 μm, height: 4 μm, number of bumps: 362

Substrate D2 . . . area: 75 μm×75 μm, space: 20 μm, height: 4 μm, number of bumps: 362

Substrate D3 . . . area: 40 μm×40 μm, space: 16 μm, height: 4 μm, number of bumps: 362

Substrate D4 . . . area: 30 μm×30 μm, space: 12 μm, height: 4 μm, number of bumps: 362

Substrate D5 . . . area: 20 μm×20 μm, space: 7 μm, height: 4 μm, number of bumps: 362

Substrate D6 . . . area: 10 μm×10 μm, space: 6 μm, height: 3 μm, number of bumps: 362

(Step l1)

Next, the connection between the evaluation chip (3.0×3.0 mm, thickness: 0.5 mm) and the evaluation substrate (thickness: 0.5 mm) was performed using the anisotropically conductive film produced in the step i1 according to the following procedures i) to iii), thereby obtaining a connection structure.

i) A separator (silicone-treated polyethylene terephthalate film, thickness: 40 μm) on one surface of an anisotropically conductive film (3.5×19 mm) was peeled off, the anisotropically conductive film and the evaluation substrate were brought into contact with each other and pasted at 80° C. and 0.98 MPa (10 kgf/cm$^2$).

ii) The separator was peeled off, and the positioning between a bump of the evaluation chip and a bump of the evaluation substrate was performed.

iii) Heating and pressurization were performed from the upper part of the chip under the conditions of 180° C., 40 gf/bump, and 10 seconds, thereby performing main connection. Seven kinds of connection structures in total according to (1) to (6) each were produced by combinations of "Chip/Anisotropically conductive film/Substrate" in the following (1) to (6).

(1) Chip C1/Anisotropically conductive film having a thickness of 40 μm/Substrate D1
(2) Chip C2/Anisotropically conductive film having a thickness of 30 μm/Substrate D2
(3) Chip C3/Anisotropically conductive film having a thickness of 20 μm/Substrate D3
(4) Chip C4/Anisotropically conductive film having a thickness of 8 μm/Substrate D4
(5) Chip C5/Anisotropically conductive film having a thickness of 6 μm/Substrate D5
(6) Chip C6/Anisotropically conductive film having a thickness of 4 μm/Substrate D6

<Evaluation of Connection Structure>

For a part of the obtained connection structure, a conductive resistance test and an insulation resistance test were performed as described below.

(Conductive Resistance Test-Moisture Absorption and Heat Resistance Test)

As for the conductive resistance between the chip provided with gold bumps (bumps)/the substrate provided with gold bumps (bumps), initial values of the conductive resistance and values after a moisture absorption and heat resistance test (exposure for 100, 500, and 1000 hours under the conditions of a temperature of 85° C. and a humidity of 85%) were measured for 20 samples, and an average value of these values was calculated.

The conductive resistance was evaluated from the obtained average value according to the following criteria. The results are shown in Table 3. Note that, a case satisfying the following criterion A or B after 1000 hours of the moisture absorption and heat resistance test is determined that the conductive resistance is favorable.

A: The average value of conductive resistance is less than $2\Omega$.
B: The average value of conductive resistance is $2\Omega$ or more and less than $5\Omega$.
C: The average value of conductive resistance is $5\Omega$ or more and less than $10\Omega$.
D: The average value of conductive resistance is $10\Omega$ or more and less than $20\Omega$.
E: The average value of conductive resistance is $20\Omega$ or more.

(Conductive Resistance Test-High-Temperature Exposure Test)

As for the conductive resistance between the chip provided with gold bumps (bumps)/the substrate provided with gold bumps (bumps), initial values of the conductive resistance and values after a high-temperature exposure test (exposure for 100, 500, and 1000 hours under the condition of a temperature of 100° C.) were measured for 20 samples. Note that, after high-temperature exposure, dropping impact was applied, and the conductive resistance of the sample after the dropping impact was measured. The dropping impact was generated by fixing a connection structure to a metal plate with screws and dropping the connection structure from a height of 50 cm. After the dropping, a DC resistance value in a solder bonding portion (four places) at a chip corner having the largest impact was measured, the breakage was regarded to occur when the measured value was increased five times or more from the initial resistance, and the evaluation was performed. Note that, measurement was performed at four places for each sample, that is, 80 places in total. The results are shown in Table 4. A case satisfying the following criterion A or B after the number of times of dropping was 20 was evaluated that the solder connection reliability is favorable.

A: The number of solder connecting portions with the measured value was increased five times or more from the initial resistance was 0.
B: The number of solder connecting portions with the measured value was increased five times or more from the initial resistance was 1 or more and 5 or less.
C: The number of solder connecting portions with the measured value was increased five times or more from the initial resistance was 6 or more and 20 or less.
D: The number of solder connecting portions with the measured value was increased five times or more from the initial resistance was 21 or more.

(Insulation Resistance Test)

As for the insulation resistance between the chip electrodes, initial values of the insulation resistance and values after a migration test (exposure for 100, 500, and 1000 hours under the conditions of a temperature of 60° C., a humidity of 90%, and an application voltage of 20 V) were measured for 20 samples, and the proportion of samples having an insulation resistance value of $10^9\Omega$ or more among the total 20 samples was calculated. The insulation resistance was evaluated from the obtained proportion according to the following criteria. The results are shown in Table 5. Note that, a case satisfying the following criterion A or B after 1000 hours of the migration test is determined that the insulation resistance is favorable.

A: The proportion of samples having an insulation resistance value of $10^9\Omega$ or more is 100%.
B: The proportion of samples having an insulation resistance value of $10^9\Omega$ or more is 90% or more and less than 100%.
C: The proportion of samples having an insulation resistance value of $10^9\Omega$ or more is 80% or more and less than 90%.
D: The proportion of samples having an insulation resistance value of $10^9\Omega$ or more is 50% or more and less than 80%.
E: The proportion of samples having an insulation resistance value of $10^9\Omega$ or more is less than 50%.

Examples 2 to 6

Anisotropically conductive films and connection structures were produced by the same method as in Example 1, except that solder particles produced by the same method as in Production Examples 2 to 6 were used, and a transfer mold having the same shape as that of the base substrate used in solder particle production of Production Examples 2 to 6 was used.

TABLE 3

|  |  |  |  | Example 1 Production Example 1 | Example 2 Production Example 2 | Example 3 Production Example 3 | Example 4 Production Example 4 | Example 5 Production Example 5 | Example 6 Production Example 6 |
|---|---|---|---|---|---|---|---|---|---|
|  |  | Solder particle |  |  |  |  |  |  |  |
| Conductive resistance | Moisture absorption and heat resistance test | (1) | Initial |  |  |  |  | A | A |
|  |  |  | After 100 hours |  |  |  |  | A | A |
|  |  |  | After 500 hours |  |  |  |  | A | A |
|  |  |  | After 1000 hours |  |  |  |  | B | A |
|  |  | (2) | Initial |  |  |  | A | A |  |
|  |  |  | After 100 hours |  |  |  | A | A |  |
|  |  |  | After 500 hours |  |  |  | A | A |  |
|  |  |  | After 1000 hours |  |  |  | B | B |  |
|  |  | (3) | Initial |  |  | A | A |  |  |
|  |  |  | After 100 hours |  |  | A | A |  |  |
|  |  |  | After 500 hours |  |  | B | B |  |  |
|  |  |  | After 1000 hours |  |  | B | B |  |  |

TABLE 3-continued

| | Solder particle | | Example 1 Production Example 1 | Example 2 Production Example 2 | Example 3 Production Example 3 | Example 4 Production Example 4 | Example 5 Production Example 5 | Example 6 Production Example 6 |
|---|---|---|---|---|---|---|---|---|
| | (4) | Initial | | A | A | | | |
| | | After 100 hours | | A | A | | | |
| | | After 500 hours | | B | B | | | |
| | | After 1000 hours | | B | B | | | |
| | (5) | Initial | A | A | | | | |
| | | After 100 hours | B | A | | | | |
| | | After 500 hours | B | B | | | | |
| | | After 1000 hours | B | B | | | | |
| | (6) | Initial | A | | | | | |
| | | After 100 hours | B | | | | | |
| | | After 500 hours | B | | | | | |
| | | After 1000 hours | B | | | | | |

TABLE 4

| | | | Solder particle | Example 1 Production Example 1 | Example 2 Production Example 2 | Example 3 Production Example 3 | Example 4 Production Example 4 | Example 5 Production Example 5 | Example 6 Production Example 6 |
|---|---|---|---|---|---|---|---|---|---|
| Conductive resistance | High-temperature exposure test | (1) | Initial | | | | | A | A |
| | | | After 100 hours | | | | | A | A |
| | | | After 500 hours | | | | | A | A |
| | | | After 1000 hours | | | | | B | A |
| | | (3) | Initial | | | A | A | | |
| | | | After 100 hours | | | A | A | | |
| | | | After 500 hours | | | B | B | | |
| | | | After 1000 hours | | | B | B | | |
| | | (5) | Initial | A | A | | | | |
| | | | After 100 hours | B | A | | | | |
| | | | After 500 hours | B | B | | | | |
| | | | After 1000 hours | B | B | | | | |

TABLE 5

| | | | Solder particle | Example 1 Production Example 1 | Example 2 Production Example 2 | Example 3 Production Example 3 | Example 4 Production Example 4 | Example 5 Production Example 5 | Example 6 Production Example 6 |
|---|---|---|---|---|---|---|---|---|---|
| Insulation resistance | Moisture absorption and heat resistance test | (1) | Initial | | | | | A | A |
| | | | After 100 hours | | | | | A | A |
| | | | After 500 hours | | | | | A | A |
| | | | After 1000 hours | | | | | B | A |
| | | (2) | Initial | | | | A | A | |
| | | | After 100 hours | | | | A | A | |
| | | | After 500 hours | | | | A | A | |
| | | | After 1000 hours | | | | B | B | |
| | | (3) | Initial | | | A | A | | |
| | | | After 100 hours | | | A | A | | |
| | | | After 500 hours | | | B | B | | |
| | | | After 1000 hours | | | B | B | | |
| | | (4) | Initial | | A | A | | | |
| | | | After 100 hours | | A | A | | | |
| | | | After 500 hours | | B | B | | | |
| | | | After 1000 hours | | B | B | | | |
| | | (5) | Initial | A | A | | | | |
| | | | After 100 hours | B | A | | | | |
| | | | After 500 hours | B | B | | | | |
| | | | After 1000 hours | B | B | | | | |
| | | (6) | Initial | A | | | | | |
| | | | After 100 hours | B | | | | | |
| | | | After 500 hours | B | | | | | |
| | | | After 1000 hours | B | | | | | |

<Evaluation of Connection Structure>

Figure 25A:
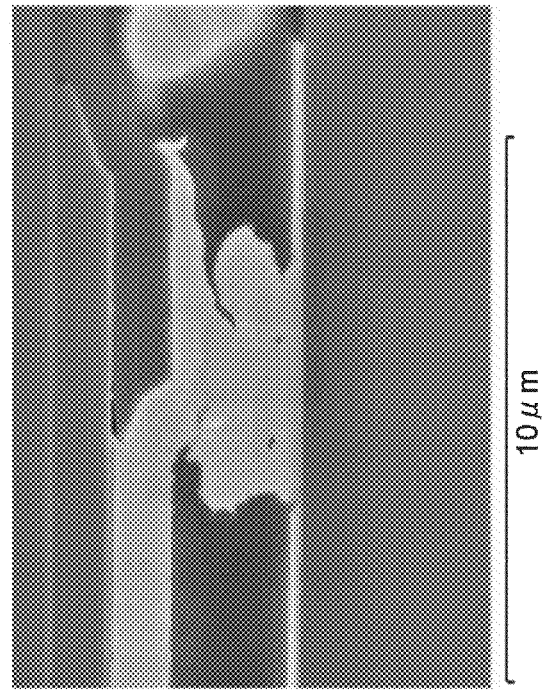
FIG. 25(a) is a cross-sectional image of a connection structure after pressing and heating.
Figure 25B:
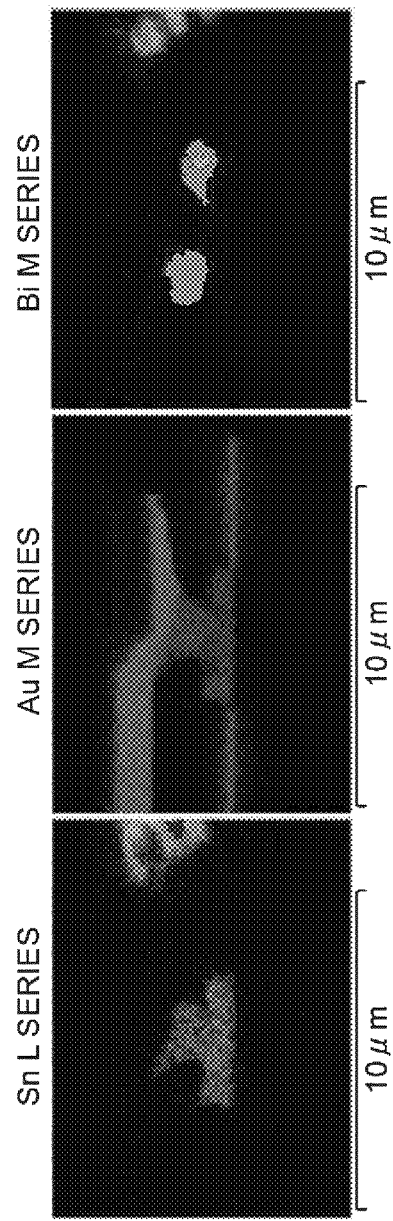
FIG. 25(b) is a view showing EDX analysis results of the cross-sectional image.

The connection structure used in the evaluation was immobilized with an epoxy injection type resin, then cut with a refine saw, and polished using polishing paper until a connection cross-sectional portion at which the gold bump of the evaluation chip, the solder particle, and the gold bump of the evaluation substrate were seen. Thereafter, the connection cross-section was processed to be flat using a cryogenic milling device (IB-19520CCP, manufactured by JEOL Ltd.) at −120° C. or lower and 4.0 kV. A platinum layer was formed on this cross-section processed portion to have a thickness of about 5 nm, and SEM observation and EDX analysis were performed. As a result, it was confirmed that, in (5) of Example 2, a certain distance between the gold bump of the evaluation chip and the gold bump of the evaluation substrate is maintained immediately after the connection structure is formed, and the gold bump of the evaluation chip and the gold bump of the evaluation substrate are connected via the alloy layer of gold and tin. Furthermore, the bismuth portion existed at a position in contact with this alloy layer. An SEM image of the cross-section is shown in FIG. 25(a), and EDX analysis results of the cross-section are shown in FIG. 25(b). In the cross-sectional structure after the evaluation test, the alloy layer of gold and tin spread on each gold bump side, but there was generally no difference from the cross-sectional structure before the test.

were disposed at positions corresponding to the electrode disposition pattern of the evaluation substrate 7. Furthermore, three alignment marks were disposed on the surface of the base substrate 7 at the same time of the recess formation. The outline of the base substrate 7 is shown in Table 6.

TABLE 6

| | | Base substrate 7 | Base substrate 8 | Base substrate 9 | Base substrate 10 | Base substrate 11 | Base substrate 12 |
|---|---|---|---|---|---|---|---|
| Opening diameter | μm | 3.1 | 6.3 | 6.0 | 16.3 | 23.1 | 33.3 |
| Bottom portion diameter | μm | 2.0 | 4.0 | 6.5 | 4.1 | 3.7 | 3.1 |
| Depth | μm | 1.0 | 3.0 | 1.5 | 4.3 | 6.6 | 8.3 |
| X-direction pitch | μm | 16 | 32 | 48 | 144 | 192 | 280 |
| Y-direction pitch | μm | 8 | 16 | 24 | 72 | 96 | 140 |

Solder fine particles were obtained in the same manner as in the step a1, the solder fine particles were disposed in the recesses in the same manner as in the step b1 except that the base substrate 7 was used, and a solder bump forming member 7 having solder particles in the recesses was obtained by the step c1.

<Evaluation of Solder Bump Forming Member>

A part of the solder bump forming member 7 was fixed on an SEM observation stage surface and the surface was subjected to platinum sputtering. The diameters of 300 solder particles were measured with an SEM to calculate an average particle diameter and a C.V. value. The results are shown in Table 7. Furthermore, the surface shape of a part of the solder bump forming member 7 was measured using a laser microscope (manufactured by Olympus Corporation, LEXT OLS5000-SAF), and the height of the solder particle from the base substrate surface was measured to calculate an average value of heights of 300 solder particles. The results are shown in Table 7.

TABLE 7

| | | Production Example 7 | Production Example 8 | Production Example 9 | Production Example 10 | Production Example 11 | Production Example 12 |
|---|---|---|---|---|---|---|---|
| Average particle diameter | μm | 2.1 | 4.0 | 6.1 | 15.9 | 21.0 | 32.0 |
| C.V. value | % | 18.0 | 7.5 | 6.9 | 4.7 | 4.0 | 3.4 |
| Height | μm | 0.6 | 1.0 | 1.6 | 3.9 | 4.5 | 7.0 |

It is considered that, in Examples 1 to 6, the solder particles and the gaps between the gold bumps are maintained by the insulating resin portion, alloying of the tin component of the solder and gold and re-disposition of bismuth proceed, and thus a stable connection structure is obtainable.

<Production of Solder Bump Forming Member>

Production Example 7

(Step m1) Production of Base Substrate

A liquid photosensitive resist (manufactured by Showa Denko Materials Co., Ltd., AH series) was applied onto a 6-inch silicon wafer by a spin coating method to have a thickness of 1.5 μm. The photosensitive resist on the silicon wafer was exposed and developed to obtain a base substrate 7 having recesses with an opening diameter of 2.3 μmϕ, a bottom portion diameter of 2.0 μmϕ, and a depth of 1.5 μm (the bottom portion diameter of 2.0 μmϕ is positioned at the center of the opening diameter of 2.3 μmϕ when the opening is viewed from the upper surface). Note that, these recesses Production Examples 8 to 12

A solder bump forming member was produced and evaluated in the same manner as in Production Example 7, except that the thickness of the photosensitive resist was changed to the depth value shown in Table 6, the recess size was also changed as shown in Table 6, and the recess disposition position was set to a position corresponding to electrode disposition pattern of the evaluation substrate described in Table 6. The results are shown in Table 7.

<Production of Evaluation Chip Provided with Solder Bumps>

(Step j2) Preparation of Evaluation Chip

Six kinds of chips provided with gold bumps (5×5 mm, thickness: 0.5 mm) described below were prepared.

Chip C7 . . . electrode size: 8 μm×4 μm, pitch: X direction 16 μm, Y direction 8 μm, number of bumps: 180000

Chip C8 . . . electrode size: 16 μm×8 μm, pitch: X direction 32 μm, Y direction 16 μm, number of bumps: 46000

Chip C9 . . . electrode size: 24 μm×12 μm, pitch: X direction 48 μm, Y direction 24 μm, number of bumps: 15000

Chip C10 . . . electrode size: 72 μm×36 μm, pitch: X direction 144 μm, Y direction 72 μm, number of bumps: 3400

Chip C11 . . . electrode size: 96 μm×48 μm, pitch: X direction 192 μm, Y direction 96 μm, number of bumps: 850

Chip C12 electrode size: 140 μm×70 μm, pitch: X direction 280 μm, Y direction 140 μm, number of bumps: 420

(Step n1) Solder Bump Formation

The solder bump forming member 7 was placed on the stage of FC3000 W (manufactured by Toray Engineering Co., Ltd.), Evaluation Chip C8 was mounted on the head and then picked up, the positioning between the solder particle disposed in the recess of the solder bump forming member 7 and the electrode of Evaluation Chip C8 was performed using alignment marks on both of them, and Evaluation Chip C7 was temporally placed on the solder bump forming member 7. Thereafter, the evaluation chip was placed on the lower hot plate of a formic acid reflow furnace (manufactured by SHINKO SEIKI CO., LTD., batch-type vacuum soldering device), vacuuming was performed, formic acid gas was then filled in the furnace, the lower hot plate was heated to 145° C., and heating was performed for 1 minute. Thereafter, the formic acid gas was discharged by vacuuming, nitrogen substitution was then performed, the lower hot plate was returned to room temperature, the inside of the furnace was opened to the atmosphere, and the solder particles were transferred onto the electrodes of Evaluation Chip C7 to form solder bumps.

<Evaluation of Solder Bump>

For the evaluation chip obtained through the step n1, the number of solder particles which could be transferred to 300 electrodes (the number of solder bumps) was counted to calculate a transfer rate. Furthermore, the height of the solder bump was measured using a laser microscope (manufactured by Olympus Corporation, LEXT OLS5000-SAF), and an average value of heights of 300 solder particles was calculated. The results are shown in Table 8.

C12 described above, and alignment marks are disposed. Furthermore, lead-out wires for resistance measurement are formed on some of the gold bumps.

Substrate D7 . . . area: 8 μm×4 μm, pitch: X direction 16 μm, Y direction 8 μm, height: 2 μm, number of bumps: 180000

Substrate D8 . . . area: 16 μm×8 μm, pitch: X direction 32 μm, Y direction 16 μm, height: 3 μm, number of bumps: 46000

Substrate D9 . . . area: 24 μm×12 μm, pitch: X direction 48 μm, Y direction 24 μm, height: 3 μm, number of bumps: 15000

Substrate D10 . . . area: 72 μm×36 μm, pitch: X direction 144 μm, Y direction 72 μm, height: 3 number of bumps: 3400

Substrate D11 . . . area: 96 μm×48 μm, pitch: X direction 192 μm, Y direction 96 μm, height: 3 μm, number of bumps: 850

Substrate D12 . . . area: 140 μm×70 μm, pitch: X direction 280 μm, Y direction 140 μm, height: 3 μm, number of bumps: 420

(Step o1) Bonding of Electrode

According to the following procedures i) to iii), the evaluation chip provided with solder bumps produced in the step n1 and an evaluation substrate provided with gold bumps were connected to each other via solder bumps.

i) Evaluation Substrate D7 provided with gold bumps was placed on the stage of FC3000 W (manufactured by Toray Engineering Co., Ltd.), Evaluation Chip C7 provided with solder bumps was picked up at the head, the gold electrodes faced each other using alignment marks on both of them, and Evaluation Chip C7 provided with solder bumps was disposed on Evaluation Substrate D7 provided with gold bumps to obtain a pre-bonded sample 7.

ii) The pre-bonded sample 7 obtained in i) was placed on a lower hot plate of a formic acid reflow furnace (manufactured by SHINKO SEIKI CO., LTD., batch-type vacuum soldering device).

TABLE 8

| | Solder bump forming member | | Example 7 Production Example 7 | Example 8 Production Example 8 | Example 9 Production Example 9 | Example 10 Production Example 10 | Example 11 Production Example 11 | Example 12 Production Example 12 |
|---|---|---|---|---|---|---|---|---|
| C7 | Transfer rate | % | 99.98 | — | — | — | — | — |
| | Height average | μm | 1.5 | — | — | — | — | — |
| C8 | Transfer rate | % | — | 99.99 | — | — | — | — |
| | Height average | μm | — | 2.9 | — | — | — | — |
| C9 | Transfer rate | % | — | — | 99.99 | — | — | — |
| | Height average | μm | — | — | 4.5 | — | — | — |
| C10 | Transfer rate | % | — | — | — | 100.00 | — | — |
| | Height average | μm | — | — | — | 11.8 | — | — |
| C11 | Transfer rate | % | — | — | — | — | 100.00 | — |
| | Height average | μm | — | — | — | — | 16.5 | — |
| C12 | Transfer rate | % | — | — | — | — | — | 100.00 |
| | Height average | μm | — | — | — | — | — | 25 |

The solder bump formation was performed in the same manner as in the step n1, except that the solder bump forming films 8 to 12 and Evaluation Chips C8 to C12 were used. Further, the solder bumps of 300 electrodes were evaluated to calculate a transfer rate and a height average value. The results are shown in Table 8.

<Production of Connection Structure>

(Step k2) Preparation of Evaluation Substrate

Six kinds of evaluation substrates provided with gold bumps (70×25 mm, thickness: 0.5 mm) described below were prepared. The gold bumps are disposed at positions corresponding to gold electrodes of Evaluation Chips C7 to iii) A formic acid vacuum reflow furnace was operated, vacuuming was performed, formic acid gas was then filled in the furnace, the lower hot plate was heated to 160° C., and heating was performed for 5 minutes. Thereafter, the formic acid gas was discharged by vacuuming, nitrogen substitution was then performed, the lower hot plate was returned to room temperature, and the inside of the furnace was opened to the atmosphere. An appropriate amount of an underfill material (manufactured by Showa Denko Materials Co., Ltd., CEL series) with a viscosity adjusted was put between the evaluation chip and the evaluation substrate and filled therebetween by vacuuming, and then the material was cured at 125° C. for 3 hours to produce a connection structure between the evaluation chip and the evaluation substrate. Combinations of respective materials used in the production of the connection structure are as described below.
(7) Chip C7/Solder bump forming member 7/Substrate D7
(8) Chip C8/Solder bump forming member 8/Substrate D8
(9) Chip C9/Solder bump forming member 9/Substrate D9
(10) Chip C10/Solder bump forming member 10/Substrate D10
(11) Chip C11/Solder bump forming member 11/Substrate D11
(12) Chip C12/Solder bump forming member 12/Substrate D12

<Evaluation of Connection Structure>

For a part of the obtained connection structure, a conductive resistance test and an insulation resistance test were performed in the same manner as described above. Results are shown in Table 9, Table 10, and Table 11.

TABLE 9

| | | Bonding body | Solder bump forming member | | Example 7 Production Example 7 | Example 9 Production Example 9 | Example 12 Production Example 12 |
|---|---|---|---|---|---|---|---|
| Conductive resistance | High-temperature exposure test | | (7) | Initial | A | | |
| | | | | After 100 hours | A | | |
| | | | | After 500 hours | A | | |
| | | | | After 1000 hours | B | | |
| | | | (8) | Initial | | A | |
| | | | | After 100 hours | | A | |
| | | | | After 500 hours | | A | |
| | | | | After 1000 hours | | B | |
| | | | (9) | Initial | | | A |
| | | | | After 100 hours | | | A |
| | | | | After 500 hours | | | A |
| | | | | After 1000 hours | | | B |

TABLE 10

| | | Bonding body | Solder bump forming member | | Production Example 25 | Production Example 26 | Production Example 27 | Production Example 28 | Production Example 29 | Production Example 30 |
|---|---|---|---|---|---|---|---|---|---|---|
| Insulation resistance | Moisture absorption and heat resistance test | | (8) | Initial | A | | | | | |
| | | | | After 100 hours | A | | | | | |
| | | | | After 500 hours | A | | | | | |
| | | | | After 1000 hours | B | | | | | |
| | | | (9) | Initial | | A | | | | |
| | | | | After 100 hours | | A | | | | |
| | | | | After 500 hours | | A | | | | |
| | | | | After 1000 hours | | B | | | | |
| | | | (10) | Initial | | | A | | | |
| | | | | After 100 hours | | | A | | | |
| | | | | After 500 hours | | | A | | | |
| | | | | After 1000 hours | | | A | | | |
| | | | (11) | Initial | | | | A | | |
| | | | | After 100 hours | | | | A | | |
| | | | | After 500 hours | | | | A | | |
| | | | | After 1000 hours | | | | A | | |
| | | | (12) | Initial | | | | | A | |
| | | | | After 100 hours | | | | | A | |
| | | | | After 500 hours | | | | | A | |
| | | | | After 1000 hours | | | | | A | |
| | | | (13) | Initial | | | | | | A |
| | | | | After 100 hours | | | | | | A |
| | | | | After 500 hours | | | | | | A |
| | | | | After 1000 hours | | | | | | A |

TABLE 11

| | | Bonding body | Solder bump forming member | | Example 7 Production Example 7 | Example 8 Production Example 8 | Example 9 Production Example 9 | Example 10 Production Example 10 | Example 11 Production Example 11 | Example 12 Production Example 12 |
|---|---|---|---|---|---|---|---|---|---|---|
| Insulation resistance | Moisture absorption and heat resistance test | | (7) | Initial | A | | | | | |
| | | | | After 100 hours | A | | | | | |
| | | | | After 500 hours | A | | | | | |
| | | | | After 1000 hours | B | | | | | |

TABLE 11-continued

| Bonding body | Solder bump forming member | | Example 7 Production Example 7 | Example 8 Production Example 8 | Example 9 Production Example 9 | Example 10 Production Example 10 | Example 11 Production Example 11 | Example 12 Production Example 12 |
|---|---|---|---|---|---|---|---|---|
| (8) | Initial | | | A | | | | |
| | After 100 hours | | | A | | | | |
| | After 500 hours | | | A | | | | |
| | After 1000 hours | | | B | | | | |
| (9) | Initial | | | | A | | | |
| | After 100 hours | | | | A | | | |
| | After 500 hours | | | | A | | | |
| | After 1000 hours | | | | A | | | |
| (10) | Initial | | | | | A | | |
| | After 100 hours | | | | | A | | |
| | After 500 hours | | | | | A | | |
| | After 1000 hours | | | | | A | | |
| (11) | Initial | | | | | | A | |
| | After 100 hours | | | | | | A | |
| | After 500 hours | | | | | | A | |
| | After 1000 hours | | | | | | A | |
| (12) | Initial | | | | | | | A |
| | After 100 hours | | | | | | | A |
| | After 500 hours | | | | | | | A |
| | After 1000 hours | | | | | | | A |

Production Examples 13 to 18

Evaluation Chips C7 to C12 shown in Table 8 on which solder bumps had been formed were obtained through the production of the base substrate of the step m1, the preparation of the evaluation chip of the step j2, and the solder bump formation of the step n1.

<Production of Connection Structure>

According to the following procedures i) to iii), the evaluation chip provided with solder bumps produced in the step n1 and the evaluation substrate provided with gold bumps produced in the step k2 were connected to each other via solder bumps.

i) The evaluation substrate provided with gold bumps was set to a spin coater, and a liquid flux (NS-334, manufactured by NIHON SUPERIOR CO., LTD.) was coated on the gold bump surface side.

i) The evaluation substrate provided with gold bumps obtained in i) was placed on the stage of FC3000 W (manufactured by Toray Engineering Co., Ltd.), the evaluation chip provided with solder bumps was picked up at the head, the gold electrodes faced each other using alignment marks on both of them, and the evaluation chip provided with solder bumps was disposed on the evaluation substrate provided with gold bumps to obtain pre-bonded samples 13 to 18.

iii) The pre-bonded sample was placed on a lower hot plate of a formic acid reflow furnace (manufactured by SHINKO SEIKI CO., LTD., batch-type vacuum soldering device).

iv) A formic acid vacuum reflow furnace was operated, vacuuming was performed, nitrogen gas was then filled in the furnace, the lower hot plate was heated to 160° C., and heating was performed for 3 minutes. Thereafter, vacuuming was performed, nitrogen substitution was then performed, the lower hot plate was returned to room temperature, and the inside of the furnace was opened to the atmosphere.

v) The bonded sample was immersed in an isopropyl alcohol solution to wash out the flux residue.

vi) An appropriate amount of an underfill material (manufactured by Showa Denko Materials Co., Ltd., CEL series) with a viscosity adjusted was put between the evaluation chip and the evaluation substrate and filled therebetween by vacuuming, and then the material was cured at 125° C. for 3 hours to produce a connection structure between the evaluation chip and the evaluation substrate. Combinations of respective materials used in the production of the connection structure are as described below.

(13) Chip C7/Solder bump forming member 7/Substrate D7
(14) Chip C8/Solder bump forming member 8/Substrate D8
(15) Chip C9/Solder bump forming member 9/Substrate D9
(16) Chip C10/Solder bump forming member 10/Substrate D10
(17) Chip C11/Solder bump forming member 11/Substrate D11
(18) Chip C12/Solder bump forming member 12/Substrate D12

<Evaluation of Connection Structure>

For a part of the obtained connection structure, a conductive resistance test and an insulation resistance test were performed in the same manner as described above. Results are shown in Table 12, Table 13, and Table 14.

TABLE 12

| | | Bonding body | Solder bump forming member | | Example 13 Production Example 13 | Example 14 Production Example 14 | Example 15 Production Example 15 | Example 16 Production Example 16 | Example 17 Production Example 17 | Example 18 Production Example 18 |
|---|---|---|---|---|---|---|---|---|---|---|
| Conductive resistance | Moisture absorption and heat resistance test | (7) | | Initial | A | | | | | |
| | | | | After 100 hours | A | | | | | |
| | | | | After 500 hours | A | | | | | |
| | | | | After 1000 hours | B | | | | | |

TABLE 12-continued

| Bonding body | Solder bump forming member | | Example 13 Production Example 13 | Example 14 Production Example 14 | Example 15 Production Example 15 | Example 16 Production Example 16 | Example 17 Production Example 17 | Example 18 Production Example 18 |
|---|---|---|---|---|---|---|---|---|
| | (8) | Initial | | A | | | | |
| | | After 100 hours | | A | | | | |
| | | After 500 hours | | B | | | | |
| | | After 1000 hours | | B | | | | |
| | (9) | Initial | | | A | | | |
| | | After 100 hours | | | A | | | |
| | | After 500 hours | | | A | | | |
| | | After 1000 hours | | | B | | | |
| | (10) | Initial | | | | A | | |
| | | After 100 hours | | | | A | | |
| | | After 500 hours | | | | A | | |
| | | After 1000 hours | | | | B | | |
| | (11) | Initial | | | | | A | |
| | | After 100 hours | | | | | A | |
| | | After 500 hours | | | | | A | |
| | | After 1000 hours | | | | | B | |
| | (12) | Initial | | | | | | A |
| | | After 100 hours | | | | | | A |
| | | After 500 hours | | | | | | A |
| | | After 1000 hours | | | | | | B |

TABLE 13

| | Bonding body | Solder bump forming member | | Example 13 Production Example 13 | Example 15 Production Example 15 | Example 18 Production Example 18 |
|---|---|---|---|---|---|---|
| Conductive resistance | High-temperature exposure test | (7) | Initial | A | | |
| | | | After 100 hours | A | | |
| | | | After 500 hours | A | | |
| | | | After 1000 hours | B | | |
| | | (8) | Initial | | A | |
| | | | After 100 hours | | A | |
| | | | After 500 hours | | A | |
| | | | After 1000 hours | | B | |
| | | (9) | Initial | | | A |
| | | | After 100 hours | | | A |
| | | | After 500 hours | | | A |
| | | | After 1000 hours | | | B |

TABLE 14

| | Bonding body | Solder bump forming member | | Example 13 Production Example 13 | Example 14 Production Example 14 | Example 15 Production Example 15 | Example 16 Production Example 16 | Example 17 Production Example 17 | Example 18 Production Example 18 |
|---|---|---|---|---|---|---|---|---|---|
| Insulation resistance | Moisture absorption and heat resistance test | (7) | Initial | A | | | | | |
| | | | After 100 hours | A | | | | | |
| | | | After 500 hours | A | | | | | |
| | | | After 1000 hours | B | | | | | |
| | | (8) | Initial | | A | | | | |
| | | | After 100 hours | | A | | | | |
| | | | After 500 hours | | A | | | | |
| | | | After 1000 hours | | B | | | | |
| | | (9) | Initial | | | A | | | |
| | | | After 100 hours | | | A | | | |
| | | | After 500 hours | | | A | | | |
| | | | After 1000 hours | | | A | | | |
| | | (10) | Initial | | | | A | | |
| | | | After 100 hours | | | | A | | |
| | | | After 500 hours | | | | A | | |
| | | | After 1000 hours | | | | A | | |
| | | (11) | Initial | | | | | A | |
| | | | After 100 hours | | | | | A | |
| | | | After 500 hours | | | | | A | |
| | | | After 1000 hours | | | | | A | |

TABLE 14-continued

| Bonding body | Solder bump forming member | Example 13 Production Example 13 | Example 14 Production Example 14 | Example 15 Production Example 15 | Example 16 Production Example 16 | Example 17 Production Example 17 | Example 18 Production Example 18 |
|---|---|---|---|---|---|---|---|
| (12) | Initial |  |  |  |  |  | A |
|  | After 100 hours |  |  |  |  |  | A |
|  | After 500 hours |  |  |  |  |  | A |
|  | After 1000 hours |  |  |  |  |  | A |

REFERENCE SIGNS LIST

1: solder particle, 2: insulating film, 2a: insulating resin material, 2b: first resin layer, 2c: surface of first resin layer, 2d: second resin layer, 10: anisotropically conductive film, 30: first circuit member, 31: first circuit board, 32: first electrode, 40: second circuit member, 41: second circuit board, 42: second electrode, 55: insulating resin layer, 60: base substrate, 62: recess, 70: bonding portion, 71: first region, 72: second region, 80: intermediate layer, 111: solder fine particle.

The invention claimed is:

1. A connection structure comprising:
a first circuit member having a plurality of first electrodes;
a second circuit member having a plurality of second electrodes; and
an intermediate layer having a plurality of bonding portions electrically connecting the first electrodes and the second electrodes, wherein
at least one of the first electrode and the second electrode that are connected by the bonding portion is a gold electrode, and
90% or more of the plurality of bonding portions include a first region containing a tin-gold alloy and connecting the first electrode and the second electrode and a second region containing bismuth and being in contact with the first region.

2. The connection structure according to claim 1, wherein the intermediate layer further has an insulating resin layer sealing a space between the first circuit member and the second circuit member.

3. A method for manufacturing a connection structure, the method comprising:
a preparing step of preparing a first circuit member having a plurality of first electrodes, a second circuit member having a plurality of second electrodes, and an anisotropically conductive film;
a disposing step of disposing the first circuit member, the second circuit member, and the anisotropically conductive film such that a surface of the first circuit member on which the first electrodes are provided and a surface of the second circuit member on which the second electrodes are provided to face each other with the anisotropically conductive film interposed therebetween, to obtain a laminate in which the first circuit member, the anisotropically conductive film, and the second circuit member are laminated in this order; and
a connecting step of electrically connecting the first electrodes and the second electrodes via the bonding portions by heating the laminate in a state of being pressed in a thickness direction, wherein
at least one of the first electrode and the second electrode is a gold electrode,
the anisotropically conductive film includes an insulating film constituted by an insulating resin composition and a plurality of solder particles disposed in the insulating film,
the solder particle contains a tin-bismuth alloy, and the average particle diameter of the solder particle is 1 μm to 30 μm, and the C.V. value of the solder particle is 20% or less,
in a longitudinal section of the anisotropically conductive film, the solder particle is disposed to be arranged in a transverse direction in a state of being spaced apart from the solder particle adjacent thereto, and
90% or more of the plurality of bonding portions to be formed in the connecting step include a first region containing a tin-gold alloy and connecting the first electrode and the second electrode and a second region containing bismuth and being in contact with the first region.

4. The method according to claim 3, wherein the solder particle is a solder particle manufactured by a method including:
a solder fine particle preparing step of preparing a base substrate having a plurality of recesses and solder fine particles containing a tin-bismuth alloy;
an accommodating step of accommodating at least some of the solder fine particles in the recess; and
a fusing step of fusing the solder fine particles accommodated in the recess to form a solder particle inside the recess.

5. The method according to claim 4, wherein the C.V. value of the solder fine particle to be prepared in the solder fine particle preparing step exceeds 20.

6. The method according to claim 3, wherein the anisotropically conductive film is an anisotropically conductive film manufactured by a method including:
a transferring step of bringing an insulating resin composition into contact with an opening side of a recess of a base substrate having a plurality of recesses in which the solder particles are accommodated in the recesses, to obtain a first resin layer to which the solder particles are transferred; and
a laminating step of forming a second resin layer constituted by an insulating resin composition on a surface of the first resin layer on a side to which the solder particles are transferred, to obtain an anisotropically conductive film.

* * * * *